(12) United States Patent
Feng et al.

(10) Patent No.: US 12,197,034 B2
(45) Date of Patent: Jan. 14, 2025

(54) BI-DIRECTIONAL CLOSED LOOP MULTI-FOCUS-POSITION LENS APPARATUS AND METHOD

(71) Applicant: Hand Held Products, Inc., Charlotte, NC (US)

(72) Inventors: Chen Feng, Mt. Laurel, NJ (US); Eric Youngblood, Matthews, NC (US); Tao Xian, Mt. Laurel, NJ (US)

(73) Assignee: Hand Held Products, Inc., Charlotte, NC (US)

( * ) Notice: Subject to any disclaimer, the term of this patent is extended or adjusted under 35 U.S.C. 154(b) by 44 days.

(21) Appl. No.: 18/115,421

(22) Filed: Feb. 28, 2023

(65) Prior Publication Data

US 2024/0288659 A1    Aug. 29, 2024

(51) Int. Cl.
*G02B 7/09* (2021.01)
*G01K 1/02* (2021.01)
(Continued)

(52) U.S. Cl.
CPC .................. *G02B 7/09* (2013.01); *G01K 1/02* (2013.01); *G01R 33/02* (2013.01); *G02B 7/023* (2013.01);
(Continued)

(58) Field of Classification Search
CPC .......... G02B 7/09; G02B 7/023; G02B 7/102; G02B 2207/117; G01K 1/02; G01R 33/02; G03B 3/10
See application file for complete search history.

(56) References Cited

U.S. PATENT DOCUMENTS

| 9,134,503 B2 | 9/2015 | Topliss |
| 9,392,188 B2 * | 7/2016 | Shabtay ................... G02B 7/09 |

(Continued)

FOREIGN PATENT DOCUMENTS

| CN | 108345083 A | 7/2018 |
| CN | 110908067 A | 3/2020 |

(Continued)

OTHER PUBLICATIONS

Intention to grant Mailed on Jan. 19, 2024 for EP Application No. 22152327, 9 page(s).

(Continued)

*Primary Examiner* — Mekonnen D Dagnew
(74) *Attorney, Agent, or Firm* — ALSTON & BIRD LLP

(57) ABSTRACT

An example bi-directional closed loop multi-focus-position lens apparatus comprises a barrel lens assembly moveable along a longitudinal axis and comprising top and bottom magnetic elements, top and bottom coil elements, a magnetic field sensor, a temperature sensor, a processor, and a non-transitory memory storing predetermined calibration data. The lens apparatus applies current to the coil elements to move the lens assembly toward a desired focus position, captures a magnetic field and temperature within the lens apparatus, compares the captured magnetic field and the captured temperature to the calibration data to determine a current position of the lens assembly, determines if the current position is the desired focus position, and, if the current position is not the desired focus position, adjusts the coil current to move the lens assembly from the current position toward the desired focus position.

20 Claims, 14 Drawing Sheets

(51) Int. Cl.
*G01R 33/02* (2006.01)
*G02B 7/02* (2021.01)
*G02B 7/10* (2021.01)
*G03B 3/10* (2021.01)

(52) U.S. Cl.
CPC .............. *G02B 7/102* (2013.01); *G03B 3/10* (2013.01); *G02B 2207/117* (2013.01)

(56) References Cited

U.S. PATENT DOCUMENTS

| | | | |
|---|---|---|---|
| 9,538,065 | B2* | 1/2017 | Nagaraja ............... H04N 23/676 |
| 10,036,896 | B2 | 7/2018 | Hee et al. |
| 2007/0035628 | A1 | 2/2007 | Kanai |
| 2007/0047942 | A1 | 3/2007 | Chang et al. |
| 2008/0266684 | A1 | 10/2008 | Chang |
| 2012/0237147 | A1 | 9/2012 | Utz |
| 2014/0327972 | A1 | 11/2014 | Yamano |
| 2015/0296143 | A1 | 10/2015 | Kang et al. |
| 2015/0373272 | A1 | 12/2015 | Lim et al. |
| 2016/0231528 | A1 | 8/2016 | Wong et al. |
| 2016/0252702 | A1 | 9/2016 | Tsuchiya et al. |
| 2018/0364450 | A1 | 12/2018 | Lee et al. |
| 2019/0196137 | A1 | 6/2019 | Ushioda |
| 2020/0341350 | A1 | 10/2020 | Tseng et al. |
| 2021/0003842 | A1 | 1/2021 | Gross |
| 2021/0231904 | A1 | 7/2021 | Son et al. |
| 2021/0239932 | A1* | 8/2021 | Feng ................... H02K 41/031 |
| 2021/0364733 | A1 | 11/2021 | Lee et al. |
| 2021/0382262 | A1 | 12/2021 | Wu et al. |
| 2022/0046151 | A1 | 2/2022 | Shabtay et al. |
| 2022/0236514 | A1 | 7/2022 | Chen et al. |

FOREIGN PATENT DOCUMENTS

| | | |
|---|---|---|
| CN | 210488101 U | 5/2020 |
| EP | 3862803 A1 | 8/2021 |
| JP | 2007-074696 A | 3/2007 |
| JP | 2010-068635 A | 3/2010 |
| JP | 2012-093558 A | 5/2012 |
| JP | 3200481 U | 10/2015 |
| JP | 2018-120072 A | 8/2018 |
| WO | 2020/013465 A1 | 1/2020 |
| WO | 2020/027588 A1 | 2/2020 |
| WO | 2022/164819 A1 | 8/2022 |

OTHER PUBLICATIONS

Notice of Allowance and Fees Due (PTOL-85) Mailed on Sep. 26, 2023 for U.S. Appl. No. 17/157,986, 10 page(s).
English Translation of JP Office Action dated Jun. 4, 2024 for JP Application No. 2023106066, 3 page(s).
JP Office Action Mailed on Jun. 4, 2024 for JP Application No. 2023106066, 4 page(s).
English Translation of JP Notice of Allowance, including Search Report dated May 29, 2023 for JP Application No. 2022005668, 2 page(s).
English Translation of JP Office Action dated Apr. 5, 2023 for JP Application No. 2022005668, 5 page(s).
English Translation of JP Office Action dated Dec. 7, 2022 for JP Application No. 2022005668, 4 page(s).
English Translation of JP Office Action Mailed on Dec. 7, 2022 for JP Application No. 2022005668.
European search report and Search opinion Mailed on Dec. 20, 2022 for EP Application No. 22152327.7.
European search report Mailed on Dec. 20, 2022 for EP Application No. 22152327, 9 page(s).
Extended European Search Report Mailed on Jul. 21, 2023 for EP Application No. 23158736, 7 page(s).
JP Notice of Allowance, including Search Report Mailed on May 29, 2023 for JP Application No. 2022005668, 3 page(s).
JP Office Action Mailed on Apr. 5, 2023 for JP Application No. 2022005668, 7 page(s).
JP Office Action Mailed on Dec. 7, 2022 for JP Application No. 2022005668.
Non-Final Rejection Mailed on Jun. 12, 2023 for U.S. Appl. No. 17/157,986, 11 page(s).
Requirement for Restriction/Election Mailed on Mar. 20, 2023 for U.S. Appl. No. 17/157,986, 7 page(s).
Decision to grant a European patent Mailed on May 10, 2024 for EP Application No. 22152327, 2 page(s).
CN Office Action Mailed on Jun. 17, 2024 for CN Application No. 202210090173, 6 page(s).
English Translation of CN Office Action dated Jun. 17, 2024 for CN Application No. 202210090173, 5 page(s).
European search report Mailed on Jul. 30, 2024 for EP Application No. 24156850, 8 page(s).
EP Office Action Mailed on Sep. 6, 2024 for EP Application No. 24176898, 3 page(s).
English Translation of JP Office Action dated Oct. 2, 2024 for JP Application No. 2023106066, 2 page(s).
JP Office Action Mailed on Oct. 2, 2024 for JP Application No. 2023106066, 4 page(s).

* cited by examiner

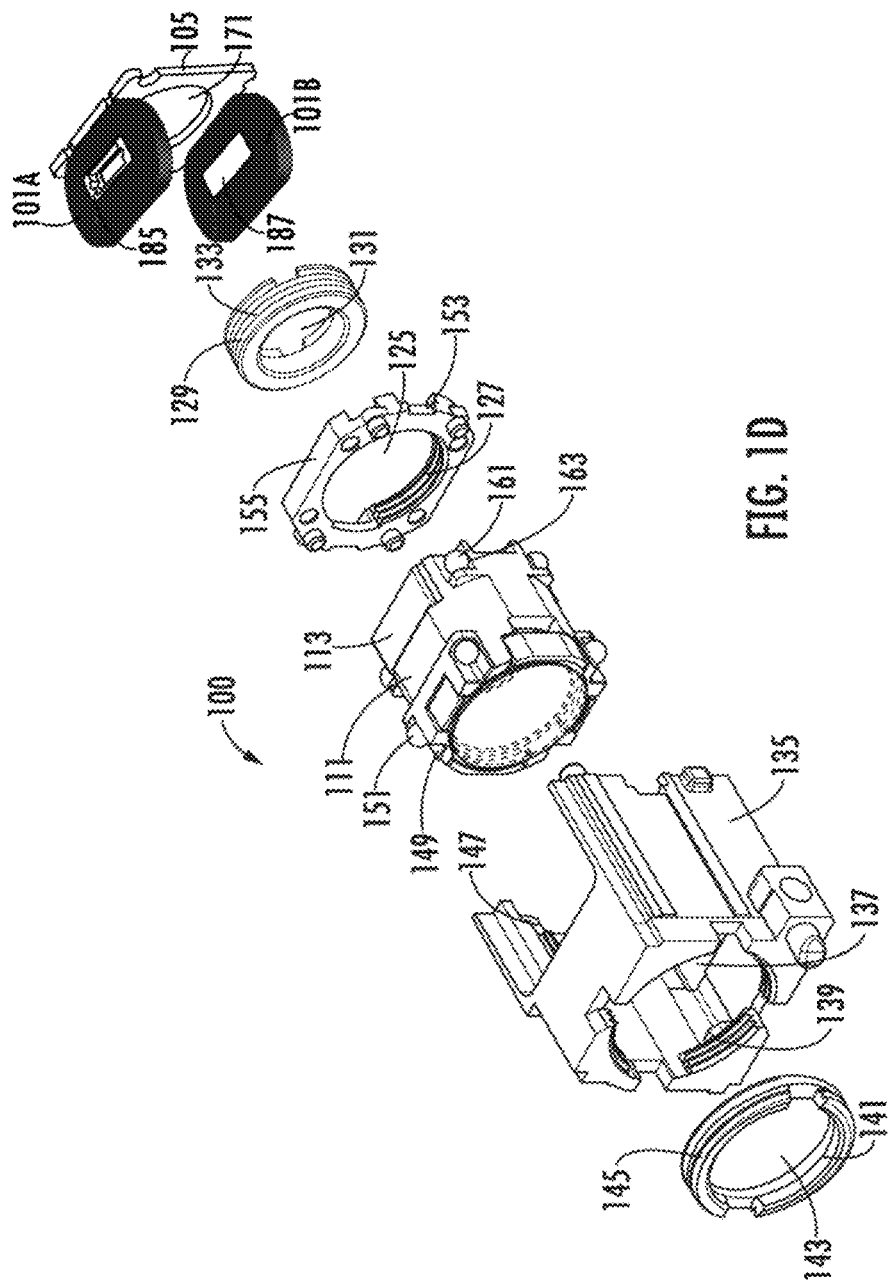

BI-DIRECTIONAL CLOSED LOOP MULTI-FOCUS-POSITION LENS APPARATUS AND METHOD

TECHNOLOGICAL FIELD

Embodiments of the present disclosure generally relate to focusing lens assemblies for imaging apparatuses, such as, but not limited to, barcode and/or other symbology scanners.

BACKGROUND

Applicant has identified many technical challenges and difficulties associated with focusing lens assemblies. For example, many focusing lens assemblies use mechanical stops to determine or set the focus position of the lens. However, due to the tight tolerances needed for the positioning of such mechanical stops, it is difficult during the manufacturing process to ensure that the mechanical stops are installed in the required positions. Further, due to the harsh operating conditions such focusing lens assemblies may encounter, it is difficult to ensure that the mechanical stops remain in the required positions.

Through applied effort, ingenuity, and innovation, Applicant has solved many of these identified problems by developing embodied in the present disclosure, which are described in detail below.

BRIEF SUMMARY

Various embodiments described herein relate to an example bi-directional closed loop multi-focus-position lens apparatus, as well as example methods for focusing the example bi-directional closed loop multi-focus-position lens apparatus.

In accordance with some embodiments of the present disclosure, an example bi-directional closed loop multi-focus-position lens apparatus is provided. In accordance with some embodiments of the present disclosure, an example bi-directional closed loop multi-focus-position lens apparatus is provided. In some embodiments, the example bi-directional closed loop multi-focus-position lens apparatus comprises a barrel lens assembly moveable along a longitudinal axis of the barrel lens assembly and comprising a top magnetic element secured on a top portion of the barrel lens assembly and a bottom magnetic element secured on a bottom portion of the barrel lens assembly, a top coil element positioned at least partly above the barrel lens assembly, a bottom coil element positioned at least partly below the barrel lens assembly, a top ferrous core positioned in a center of the top coil element, a bottom ferrous core positioned in a center of the bottom coil element; at least one processor, and at least one non-transitory memory comprising program code. In some embodiments, the at least one non-transitory memory and the program code are configured to, with the at least one processor, cause the lens apparatus to at least apply a top coil current to the top coil element and a bottom coil current to the bottom coil element to cause movement of the barrel lens assembly toward a predetermined desired focus position. In some embodiments, the predetermined desired focus position is between a neutral position and a mechanically-defined overtravel position. In some embodiments, the neutral position is a position the barrel lens assembly will attain when no top coil current is applied to the top coil element and no bottom coil current is applied to the bottom coil element such that a magnetic attraction between the top magnetic element and the top ferrous core and between the bottom magnetic element and the bottom ferrous core causes the barrel lens assembly to move to and/or remain at the neutral position.

In some embodiments, the multi-focus-position lens apparatus further comprises a magnetic field sensor for detecting a magnetic field within the lens apparatus and a temperature sensor for detecting a temperature within the lens apparatus. In some embodiments, the at least one non-transitory memory stores predetermined calibration data comprising a plurality of corresponding magnetic field values, temperatures, and positions. In some embodiments, the at least one non-transitory memory and the program code are further configured to, with the at least one processor, cause the lens apparatus to at least: capture, from the magnetic field sensor, a magnetic field within the lens apparatus; capture, from the temperature sensor, a temperature within the lens apparatus; compare the captured magnetic field and the captured temperature to the predetermined calibration data to determine a current position of the barrel lens assembly; determine if the current position is the predetermined desired focus position; if the current position is not the predetermined desired focus position, adjust the top coil current and the bottom coil current to cause movement of the barrel lens assembly from the current position toward the predetermined desired focus position, and repeat the first capture step, the second capture step, the compare step, the determine step, and the adjust step until the current position is the predetermined desired focus position; and if the current position is the predetermined desired focus position, capture an image of a target in a field of view of the barrel lens assembly.

In some embodiments, determining if the current position is the desired focus position comprises determining if the current position is within a predetermined distance of the desired focus position.

In some embodiments, the at least one non-transitory memory and the program code are configured to, with the at least one processor, further cause the lens apparatus to determine if an initial position of the barrel lens assembly is the desired focus position.

In some embodiments, the at least one non-transitory memory and the program code are configured to, with the at least one processor, further cause the lens apparatus to use a proportional-integral-derivative feedback loop to adjust the top coil current and the bottom coil current to cause movement of the barrel lens assembly from the current position toward the desired focus position.

In some embodiments, the multi-focus-position lens apparatus further comprises a top ferrous core positioned in a center of the top coil element and a bottom ferrous core positioned in a center of the bottom coil element.

In some embodiments, the barrel lens assembly has at least three possible desired focus positions. In some embodiments, a first one of the at least three possible desired focus positions is a neutral position which the barrel lens assembly will attain when no top coil current is applied to the top coil element and no bottom coil current is applied to the bottom coil element such that a magnetic attraction between the top magnetic element and the top ferrous core and between the bottom magnetic element and the bottom ferrous core causes the barrel lens assembly to move to and/or remain at the neutral position. In some embodiments, a second one of the at least three possible desired focus positions is a forward position in a first direction along the longitudinal axis of the barrel lens assembly away from the neutral position. In some embodiments, a third one of the at least three possible desired focus positions is a rearward position in a second direction along the longitudinal axis of the barrel lens assembly away from the neutral position, the second direction being opposite the first direction.

In some embodiments, the multi-focus-position lens apparatus further comprises a front mechanical stop positioned to prevent overtravel in the first direction and a rear mechanical stop positioned to prevent overtravel in the second direction. In some embodiments, the second one of the at least three possible desired focus positions is rearward of the front mechanical stop such that the barrel lens assembly does not contact the front mechanical stop in the second one of the at least three possible desired focus positions. In some embodiments, the third one of the at least three possible desired focus positions is forward of the rear mechanical stop such that the barrel lens assembly does not contact the rear mechanical stop in the third one of the at least three possible desired focus positions.

In some embodiments, a fourth one of the at least three possible desired focus positions is located between the forward position and the neutral position and a fifth one of the at least three possible desired focus positions is located between the rearward position and the neutral position.

In some embodiments, a hole is defined in either the top ferrous core or the bottom ferrous core, and the magnetic field sensor and the temperature sensor are positioned within the hole defined in either the top ferrous core or the bottom ferrous core.

In some embodiments, the multi-focus-position lens apparatus further comprises a top coil variable power circuitry electronically coupled to the top coil element to provide the top coil current to the top coil element and a bottom coil variable power circuitry electronically coupled to the bottom coil element to provide the bottom coil current to the bottom coil element.

In accordance with various embodiments of the present disclosure, a method for focusing a multi-focus-position lens apparatus is provided. In accordance with various embodiments of the present disclosure, a method for focusing a multi-focus-position lens apparatus is provided. In some embodiments, the method comprises applying a top coil current to a top coil element of the lens apparatus and a bottom coil current to a bottom coil element of the lens apparatus to cause movement of a barrel lens assembly of the lens apparatus toward a desired focus position. In some embodiments, the barrel lens assembly comprises a top magnetic element secured on a top portion of the barrel lens assembly and a bottom magnetic element secured on a bottom portion of the barrel lens assembly. In some embodiments, the barrel lens assembly is moveable along a longitudinal axis of the barrel lens assembly. In some embodiments, the top coil element is positioned at least partly above the barrel lens assembly. In some embodiments, the bottom coil element is positioned at least partly below the barrel lens assembly. In some embodiments, a top ferrous core is positioned in a center of the top coil element and a bottom ferrous core is positioned in a center of the bottom coil element. In some embodiments, the predetermined desired focus position is between a neutral position and a mechanically-defined overtravel position. In some embodiments, the neutral position is a position the barrel lens assembly will attain when no top coil current is applied to the top coil element and no bottom coil current is applied to the bottom coil element such that a magnetic attraction between the top magnetic element and the top ferrous core and between the bottom magnetic element and the bottom ferrous core causes the barrel lens assembly to move to and/or remain at the neutral position.

In some embodiments, the method further comprises capturing, from a magnetic field sensor of the lens apparatus, a magnetic field within the lens apparatus; capturing, from a temperature sensor of the lens apparatus, a temperature within the lens apparatus; comparing the captured magnetic field and the captured temperature to predetermined calibration data to determine a current position of the barrel lens assembly; determining if the current position is the desired focus position; if the current position is not the desired focus position, adjusting the top coil current and the bottom coil current to cause movement of the barrel lens assembly from the current position toward the desired focus position, and repeating the first capturing step, the second capturing step, the comparing step, the determining step, and the adjusting step until the current position is the desired focus position; and if the current position is the desired focus position, capturing an image of a target in a field of view of the barrel lens assembly. In some embodiments, the predetermined calibration data comprises a plurality of corresponding magnetic field values, temperatures, and positions.

In some embodiments, determining if the current position is the desired focus position comprises determining if the current position is within a predetermined distance of the desired focus position.

In some embodiments, the method further comprises determining if an initial position of the barrel lens assembly is the desired focus position.

In some embodiments, adjusting the top coil current and the bottom coil current to cause movement of the barrel lens assembly from the current position toward the desired focus position comprises using a proportional-integral-derivative feedback loop to adjust the top coil current and the bottom coil current to cause movement of the barrel lens assembly from the current position toward the desired focus position.

In some embodiments, the lens apparatus further comprises a top ferrous core positioned in a center of the top coil element and a bottom ferrous core positioned in a center of the bottom coil element.

In some embodiments, the barrel lens assembly has at least three possible desired focus positions. In some embodiments, a first one of the at least three possible desired focus positions is a neutral position which the barrel lens assembly will attain when no top coil current is applied to the top coil element and no bottom coil current is applied to the bottom coil element such that a magnetic attraction between the top magnetic element and the top ferrous core and between the bottom magnetic element and the bottom ferrous core causes the barrel lens assembly to move to and/or remain at the neutral position. In some embodiments, a second one of the at least three possible desired focus positions is a forward position in a first direction along the longitudinal axis of the barrel lens assembly away from the neutral position. In some embodiments, a third one of the at least three possible desired focus positions is a rearward position in a second direction along the longitudinal axis of the barrel lens assembly away from the neutral position, the second direction being opposite the first direction.

In some embodiments, the lens apparatus further comprises a front mechanical stop positioned to prevent overtravel in the first direction and a rear mechanical stop positioned to prevent overtravel in the second direction. In some embodiments, the second one of the at least three possible desired focus positions is rearward of the front mechanical stop such that the barrel lens assembly does not contact the front mechanical stop in the second one of the at least three possible desired focus positions. In some embodiments, the third one of the at least three possible desired focus positions is forward of the rear mechanical stop such that the barrel lens assembly does not contact the rear mechanical stop in the third one of the at least three possible desired focus positions.

In some embodiments, a fourth one of the at least three possible desired focus positions is located between the forward position and the neutral position and a fifth one of the at least three possible desired focus positions is located between the rearward position and the neutral position.

In some embodiments, a hole is defined in either the top ferrous core or the bottom ferrous core and the magnetic field sensor and the temperature sensor are positioned within the hole defined in either the top ferrous core or the bottom ferrous core.

In some embodiments, the lens apparatus further comprises a top coil variable power circuitry electronically coupled to the top coil element to provide the top coil current to the top coil element and a bottom coil variable power circuitry electronically coupled to the bottom coil element to provide the bottom coil current to the bottom coil element.

The foregoing illustrative summary, as well as other exemplary objectives and/or advantages of the disclosure, and the manner in which the same are accomplished, are further explained in the following detailed description and its accompanying drawings.

BRIEF DESCRIPTION OF THE DRAWINGS

The description of the illustrative embodiments may be read in conjunction with the accompanying figures. It will be appreciated that, for simplicity and clarity of illustration, elements illustrated in the figures have not necessarily been drawn to scale, unless described otherwise. For example, the dimensions of some of the elements may be exaggerated relative to other elements, unless described otherwise. Embodiments incorporating teachings of the present disclosure are shown and described with respect to the figures presented herein, in which:

FIG. 1D illustrates an example exploded view of the example multi-focus-position lens apparatus shown in FIG. 1A, in accordance with various embodiments of the present disclosure;

DETAILED DESCRIPTION OF THE INVENTION

Figure 1A:
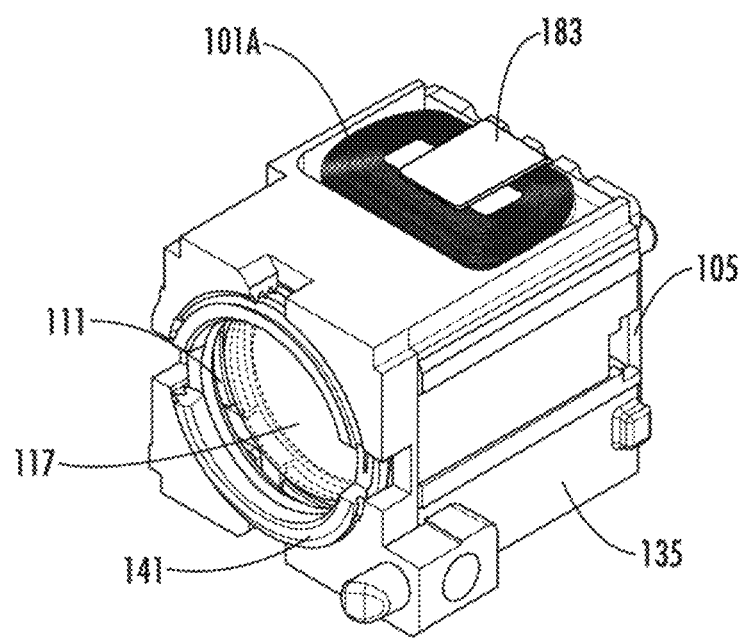
FIG. 1A illustrates an example front perspective view of an example multi-focus-position lens apparatus, in accordance with various embodiments of the present disclosure.

Some embodiments of the present disclosure will now be described more fully hereinafter with reference to the accompanying drawings, in which some, but not all embodiments of the disclosure are shown. Indeed, these disclosures may be embodied in many different forms and should not be construed as limited to the embodiments set forth herein; rather, these embodiments are provided so that this disclosure will satisfy applicable legal requirements. Like numbers refer to like elements throughout.

In the present disclosure, the phrases "in one embodiment," "according to one embodiment," and the like generally mean that the particular feature, structure, or characteristic following the phrase may be included in at least one embodiment of the present disclosure and may be included in more than one embodiment of the present disclosure (importantly, such phrases do not necessarily refer to the same embodiment).

In the present disclosure, the words "example" or "exemplary" are used herein to mean "serving as an example, instance, or illustration." Any implementation described herein as "exemplary" is not necessarily to be construed as preferred or advantageous over other implementations.

If the specification states a component or feature "may," "can," "could," "should," "would," "preferably," "possibly," "typically," "optionally," "for example," "often," or "might" (or other such language) be included or have a characteristic, that specific component or feature is not required to be included or to have the characteristic. Such a component or feature may be optionally included in some embodiments, or it may be excluded.

Imaging apparatuses are configured to enable execution of one or more image capture and processing tasks. For example, in at least some example contexts, an image apparatus is configured to enable reading of symbols, such as one or more barcodes, QR codes, data matrices, and/or the like. Often, such imaging apparatuses include one or more imagers for capturing image data object(s) representing a particular field of view defined by the imager. For example, an imager may include one or more image capture optics, such as one or more lens assemblies, coupled with an image sensor configured to capture light that traverses through the image capture optics to interact with the image sensor. In this regard, the lens assembly may define a particular field of view to be captured by the associated image sensor, and/or may define a particular focus range such that the image sensor captures an image data object that is clear and/or otherwise optimal for processing at and/or around the focus range. Such imagers may be associated with an illuminator of and/or associated with the imaging apparatus, for example including an illumination projection lens and associated illumination source, that provides light that illuminates the field of view to be captured.

Variable focusing lens apparatuses enable adjustment of the focus range to one or more different focus ranges. By adjusting the focus range, the effective range at which the lens assembly may be used to capture image data objects that are clear and/or well-defined enough to be successfully processed for a particular image processing task may be improved. For example, a variable focus lens adjustable between a first focus range and a second focus range may be used to capture image data objects sufficient for processing without repositioning an object to be scanned and/or the imaging apparatus itself.

As described above, there are many technical challenges and difficulties associated with focusing lens assemblies. To provide the ability to alter the focus, conventional implementations for multi-focus-position remain bulky, slow, and/or vulnerable to one or more environmental impacts.

For example, some focusing lens assemblies use mechanical stops to establish one or more lens positions. As an example, a lens may be moved in a first direction from a neutral position until the lens contacts a first mechanical stop thereby establishing a first non-neutral position, and the lens may be moved in a second, opposite direction from the neutral position until the lens contacts a second mechanical stop thereby establishing a second non-neutral position. In some focusing lens assemblies the difference between the neutral position and the first or second non-neutral positions may be very small—on the order of tens of microns. As such, the mechanical stops must be very precisely positioned. However, it is difficult during the manufacturing process to position the mechanical stops so precisely. Further, mechanical impacts to the focusing lens assembly (for example, from dropping the imaging apparatus) may cause one or both of the mechanical stops to shift position.

Conventional imaging apparatuses include co-owned U.S. Utility patent application Ser. No. 17/157,986, filed Jan. 25, 2021, and co-owned U.S. Utility patent application Ser. No. 17/654,4002, filed Mar. 11, 2022, the contents of which are incorporated herein by reference in their entirety.

As such, there is a need for a multi-focus-position lens apparatus that provides fast and accurate lens positioning without the use of mechanical stops for position determination that can be implemented in, for example but not limited to, industrial imaging scanners.

Embodiments herein provide multi-focus-position lens apparatuses. Embodiments include multi-focus-position lens apparatuses including a barrel lens assembly positioned based on interactions between one or more positioning magnets and one or more positioning pads. In some such embodiments, each of a pair of positioning magnets is associated with one of a pair of positioning pads. The positioning pads are each associated with a positioning coil configured to receive an electrical charge that powers the positioning coil. Calibration data is stored which comprises corresponding magnetic field values, temperatures, and positions. The powered positioning coil is configured to generate a magnetic field exerted to reposition the barrel lens assembly toward a new focus position. The magnetic field value and temperature within the multi-focus-position lens apparatus is captured and compared to the calibration data to determine the current position of the barrel lens assembly and whether the barrel lens assembly is positioned at the desired focus position. If the current position is not the desired focus position, the powered positioning coil is re-configured to generate a magnetic field exerted to reposition the barrel lens assembly from the current position toward a new focus position. The determination of the current position and repositioning of the barrel lens assembly are repeated until the barrel lens assembly is at the desired focus position, at which point an image is captured. In this regard, closed-loop control of the focus position is provided enabling the barrel lens assembly to quickly and accurately be focused without the use of mechanical stops.

Definitions

In the present disclosure, the term "element" in the present disclosure refers to one or more separable component(s) or independent unit(s) that may be used to form, construct, or otherwise be part of an example multi-focus-position lens apparatus. In some embodiments, an element may comprise one or more physical entities/structures that may provide one or more particular functions to the example multi-focus-position lens apparatus.

In the present disclosure, the term "imaging apparatus" refers to one or more hardware and/or software components configured to capture an image data object for processing. In some embodiments, an imaging apparatus includes at least one illuminator source and/or corresponding optics configured to provide an illumination onto a field for capture.

In the present disclosure, the term "powering" refers to providing a current to an electrical circuit, component, and/or electrical conductor.

In the present disclosure, the term "positioning coil" or "coil element" refers to an electrical conductor (for example, but not limited to, a current carrying wire) wound, with one or more turns, into a coil shape and configured to generate a magnetic field upon powering the positioning coil. The coil element defines a "coil inner region," which refers to the open region defined by the wound conductor of the coil element.

In accordance with some embodiments of the present disclosure, an example coil element generates a magnetic field upon being powered by a current. In particular, under Ampere's law, a current through any conductor creates a circular magnetic field around the conductor. The magnetic fields generated by the separate turns of a coil element all pass through the center of the coil element and add (or superpose) to produce a magnetic field of the coil element. In some embodiments, the magnetic field of the coil element causes a magnetic force that attracts or repulses a magnetic element (such as a magnet). In some embodiments, the strength of the magnetic force of the magnetic field generated by the coil element correlates to the amount of current passing through the coil element. For example, the more the current that flows through the coil element, the stronger the magnetic field that is generated by the coil element, and the stronger the magnetic force. The less the current that flows through the coil element, the weaker the magnetic field that is generated by the coil element, and the weaker the magnetic force.

In some embodiments, the direction (North-South or South-North) of the magnetic field produced by a coil element is determined by the polarity of the current flowing through the coil element. As such, the direction of the magnetic field produced by a coil element can be changed by changing the polarity of the current flowing through the coil element.

In some embodiments, example coil elements comprise material such as, but not limited to, copper wire, coated copper wire, tinned wire, and/or the like. In some embodiments, different coil elements in accordance with some embodiments of the present disclosure may comprise different materials In the present disclosure, the term "coil variable power circuitry" refers to hardware configured to provide current to one or more coil elements. In some example contexts, coil powering circuitry includes at least one power source connected to one or a plurality of coil elements.

In the present disclosure, the term "powered state" refers to a value of current powering each of a pair of coil elements. In an example context, a powered state represents the value of the sign of the current powering each of a pair of coil elements. The term "non-powered state" refers to a value of no current powering each of a pair of coil elements.

In the present disclosure, the term "imager" or "imaging module" refers to one or more components configured for capturing an image representing a particular field of view. In at least one example context, an imager includes at least one optical component (e.g., lens(es) and/or associated housing(s)) defining a particular field of view. Additionally or alternatively, in at least one example context, an imager includes an image sensor configured to output an image based on light that engages with the image sensor, such as via the optical components.

In the present disclosure, the term "image sensor" refers to one or more components configured to generate an image represented by a data object based on light incident on the image sensor. In some such example contexts, an image sensor converts light waves that interact with the image sensor into signals representing an image output by the sensor.

In the present disclosure, the term "imaging optical lens" refers to one or more lenses and/or supporting optical components defining an aperture that enables light to be received by an image sensor associated with the imaging optical lens. In some embodiments, an imaging optical lens is formed entirely of glass, entirely of plastic, an optical liquid material, and/or of any combination thereof.

In the present disclosure, the term "barrel lens assembly" refers to a component associated with a corresponding image sensor, the component including at least an imaging optical lens and a lens housing. In some embodiments, as described herein, the barrel lens assembly includes one or more defined areas to support a positioning magnet.

In the present disclosure, the term "magnetic element" refers to an element that produces a magnetic field. Examples of the magnetic element may include, but are not limited to, magnets.

In the present disclosure, the term "magnetic axis" refers to a straight line that joins magnetic poles of one or more magnetic fields. In some embodiments, the magnetic axis of a magnetic field generated by a coil element overlaps with the central axis of the coil element. Examples of magnetic axes are illustrated and described herein.

In the present disclosure, the term "positioning magnet" refers to a magnetic element (such as a magnet) included in a barrel lens assembly to enable shifting of a focus position for the barrel lens assembly. In some embodiments, a barrel lens assembly includes a pair of positioning magnets designed to interact with one or more associated components, such as a pair of coil elements and/or positioning pads, to change the focus position of the barrel lens assembly as described herein. Non-limiting examples of a positioning magnet includes a plated neodymium magnet, including without limitation a zinc-plated magnet, a nickel-plated magnet, and/or other protective coating.

In the present disclosure, the term "positioning pad" refers to ferrous material designed to fit within the coil inner region of a positioning coil. In one example context, a positioning pad is shaped generally as a cuboid. In another example context, a positioning pad includes an open region for receiving a controller and/or one or more sensors. A positioning coil is positioned adjacent to a positioning magnet that is associated with the positioning pad. In this regard, in some contexts, a pair of symmetrical positioning pads are positioned opposite one another, each associated with one of a pair of coil elements, the pair of coil elements positioned opposite one another, such that when the coil elements are in a non-powered state, the positioning pad is aligned with the positioning magnet in what may be termed a "neutral position."

In the present disclosure, the term "module holder" refers to a shell or a housing within which example components of an example multi-focus-position lens apparatus in accordance with various embodiments of the present disclosure may be positioned. For example, an example module holder provides housing for at least a portion of an example barrel lens assembly in accordance with some embodiments of the present disclosure, details of which are described herein.

In the present disclosure, the term "coil position" refers to a position of a positioning coil with respect to an associated barrel lens assembly. In some embodiments, for example, a top positioning coil is positioned at a first coil position located on top of an associated barrel lens assembly, and a bottom positioning coil is positioned at a second coil location located on the bottom of an associated barrel lens assembly, such that the first coil position is opposite the second coil position.

In the present disclosure, the term "bearing slot" refers to a space in a component, defined by an outer boundary, designed to receive and/or movably secure a bearing ball. In at least one example context, bearing slot opening defines a spherical, tubular, or cylindrical space configured to receive a bearing ball.

In the present disclosure, the term "bearing ball" refers to a metallic, semi-metallic, or non-metallic solid ball and/or other circular roller designed to engage a bearing slot opening of a component. In at least one example context, the bearing ball is designed to engage the bearing slot opening through sliding into the bearing slot opening.

In the present disclosure, the term "focus position" refers to a position of a barrel lens assembly within inner space of a module holder. In this regard, in an example context, the focus positioning of a barrel lens assembly represents a shift from a neutral position, and/or an absolute position, along a longitudinal axis. In an example context, a neutral position is also considered a focus position. In an example context, the focus position of barrel lens assembly is changed based on a value of power applied to one or more coil elements.

In the present disclosure, the term "front overtravel limit" refers to a position closest to the inner wall of the front of a module holder beyond the intended forward travel of the barrel lens assembly. In some embodiments, the front overtravel limit is defined by the inner wall of the front of the module holder itself. In other embodiments, the front overtravel limit is defined by one or more front overtravel limit components.

In the present disclosure, the term "rear overtravel limit" refers to a position closest to the inner wall of the rear of a module holder beyond the intended rearward travel of the barrel lens assembly. In some embodiments, the rear overtravel limit is defined by the inner wall of the rear of the module holder itself. In other embodiments, the rear overtravel limit is defined by one or more rear overtravel limit components.

In the present disclosure, the term "neutral focus position" refers to a focus position of a barrel lens assembly when each of a pair of coil elements is in a non-powered state. In an example context, the neutral focus position aligns each positioning magnet of the barrel lens assembly with an associated positioning pad.

In the present disclosure, the term "front focus position" refers to a focus position between the neutral focus position and the front overtravel limit.

In the present disclosure, the term "rear focus position" refers to a focus position between the neutral focus position and the rear overtravel limit.

In the present disclosure, the term "focus range" refers to an optimal distance between a barrel lens assembly and/or imaging apparatus and a field for the field to be in focus. In at least one example context, as the focus position of a barrel lens assembly changes, so does the focus range.

In the present disclosure, the term "predetermined focus position" refers to a discrete value of a focus position from a possible set of focus positions. For example, in at least one example context, a multi-focus-position lens apparatus is designed based on a three-state set of focus positions: a first focus position for a first powered state (e.g., positive current), a second focus position for a second powered state (e.g., negative current), and a third (or neutral) focus position for a non-powered state (e.g., no current). In the example embodiments described herein, there are a discrete number of focus positions (for example, three or five). Thus, embodiments of the present disclosure may apply to devices that may be termed "discrete focus," "discrete focusing," "multi-focus-position," "multi-position focus," and/or "multi-position focusing." Variable focus or variable focusing typically refers to a lens apparatus that may focus at any position along its axis of travel. That is, variable focus typically refers to a lens apparatus that has an infinite number of focus positions. While embodiments of the present disclosure are described herein in relation to discrete focusing or multi-position focusing lens apparatuses, embodiments of the present disclosure may be used with variable focusing lens apparatuses.

In the present disclosure, the terms "electronically coupled," "electrically coupled," "electronically connected," or "electrically connected" in the present disclosure refer to two or more electrical elements (for example but not limited to, coil elements) and/or electric circuit(s) (for example but not limited to, coil variable power circuitries) being connected through wired means (for example but not limited to, conductive wires or traces) and/or wireless means (for example but not limited to, electromagnetic field), such that energy (for example but not limited to electric current), signals, data and/or information may be transmitted to and/or received from the electrical elements and/or electric circuit(s) that are electronically coupled.

Various embodiments of the present disclosure may be implemented in a broad range of applications. For example, in the barcode scanning application, the barrel lens assembly can be configured in three discrete positions (near, middle, and far positions) to cover the entire object distance with overlaps in the depth of field of each segment. In some embodiments, to provide an extended range, five predefined positions can cover ultra-high density codes in very close range, high density codes in close range, normal density codes in middle range, low density codes in extended range and big codes in extra-far range.

Referring now to FIG. 1A to FIG. 1G, an example multi-focus-position lens apparatus 100 in accordance with various embodiments of the present disclosure is illustrated. The example multi-focus-position lens apparatus 100 overcomes the technical challenges and difficulties described above and provides technical improvements and benefits.

In the example shown in FIG. 1A to FIG. 1G, the example multi-focus-position lens apparatus 100 comprises a module holder 135. As described above, the module holder 135 provides a shell or a housing for various components of the example multi-focus-position lens apparatus 100. In the example shown in FIGS. 1A to 1G, the barrel lens assembly 111 is at least partially disposed within the module holder 135. For example, as shown in FIG. 1D, the module holder 135 comprises a plurality of walls that define a rear opening for receiving the barrel lens assembly 111. In some embodiments, the barrel lens assembly 111 is moveable within the module holder 135, details of which are described herein.

In some embodiments, the module holder 135 comprises a module holder central opening that defines/comprises an inner periphery surface of the module holder 135. In some embodiments, a front overtravel stop nut 141 is secured to the inner periphery surface of the module holder 135 and prevents the barrel lens assembly 111 from overtravel in the module holder 135 through the module holder central opening, details of which are described herein.

In various embodiments, the example barrel lens assembly 111 comprises at least one lens element 117. In particular, the at least one lens element 117 is aligned with the module holder central opening, such that light enters through the module holder central opening of the module holder 135 and onto the at least one lens element 117. In some embodiments, the at least one lens element 117 defines the axis that passes through the center of the at least one lens element 117 as the optical axis of at least one lens element 117, and the barrel lens assembly 111 is movable to a plurality of barrel lens assembly positions along the optical axis of the at least one lens element 117, details of which are described herein.

Figure 1B:
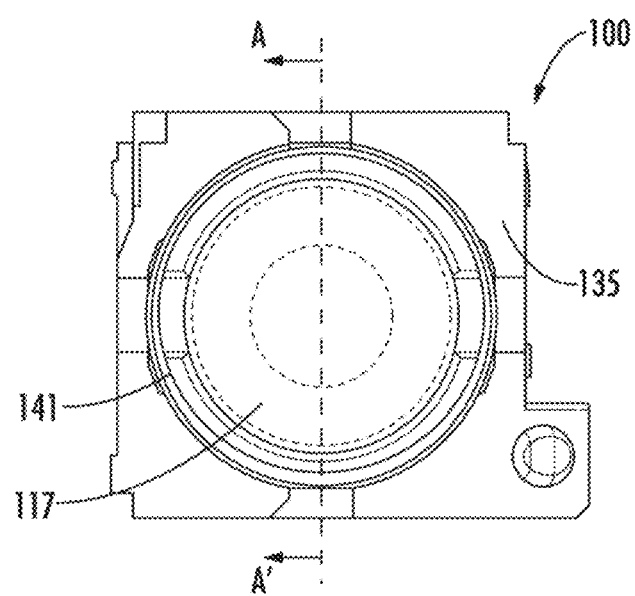
FIG. 1B illustrates an example front view of the example multi-focus-position lens apparatus shown in FIG. 1A, in accordance with various embodiments of the present disclosure.
Figure 1C:
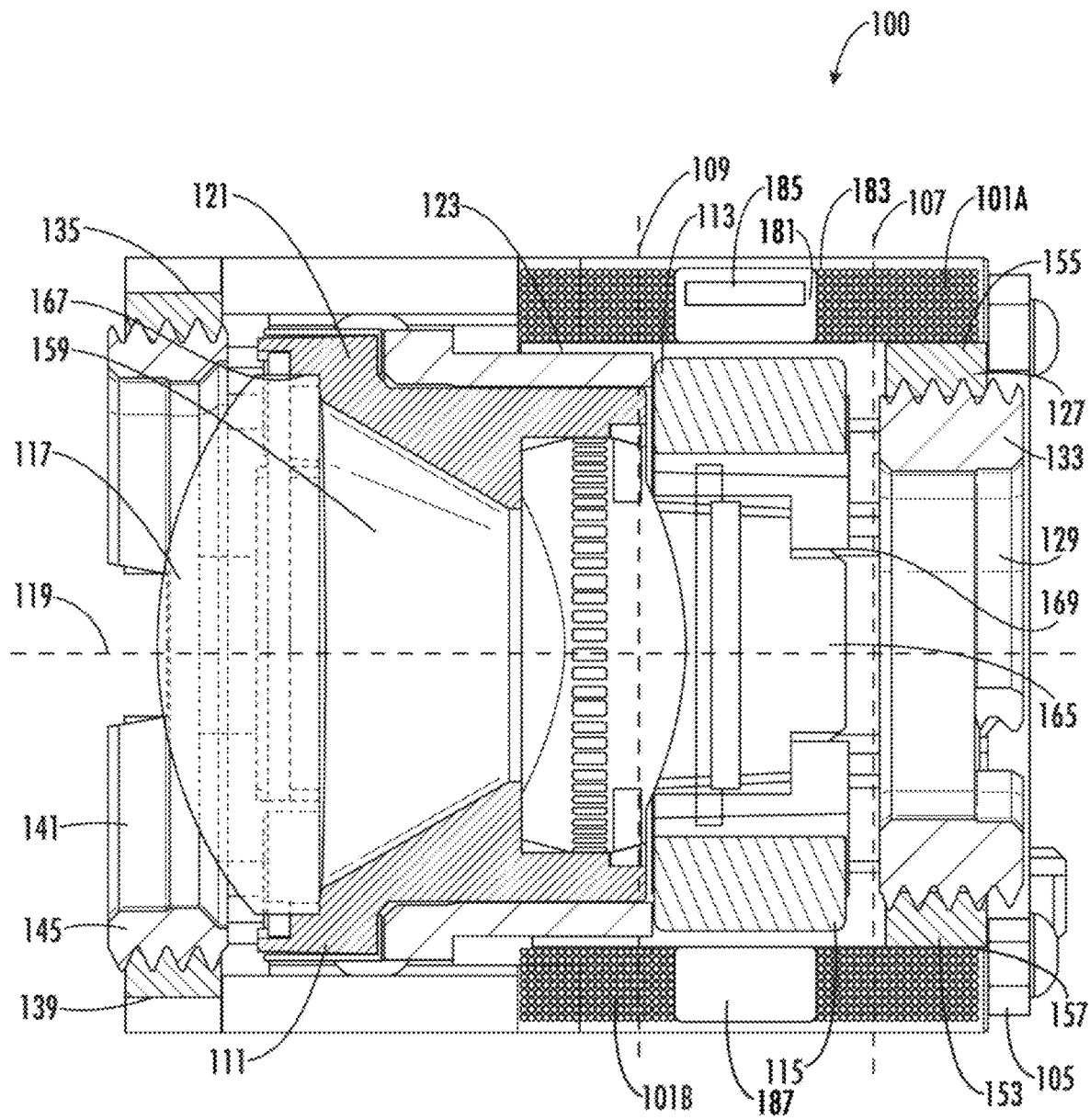
FIG. 1C illustrates an example cross section view of the example multi-focus-position lens apparatus shown in FIG. 1A, in accordance with various embodiments of the present disclosure.

Referring now to FIG. 1C and FIG. 1D, an example cross section view and an example exploded view of the example multi-focus-position lens apparatus 100 are shown. In particular, FIG. 1C illustrates an example cross section view of the example multi-focus-position lens apparatus 100 when the example multi-focus-position lens apparatus 100 is cut from line A-A' and viewed in the direction as shown in FIG. 1B. FIG. 1D illustrates an example exploded view of the example multi-focus-position lens apparatus 100.

As shown in FIG. 1C and FIG. 1D, the example multi-focus-position lens apparatus 100 comprises a holder cover 153. In some embodiments, the holder cover 153 is positioned between the top coil element 101A and the bottom coil element 101B. For example, the holder cover 153 comprises a top surface 155 and a bottom surface 157. In some embodiments, both the top surface 155 and the bottom surface 157 are on the horizontal plane. In some embodiments, the top coil element 101A is in contact with the top surface 155 of the holder cover 153. In some embodiments, the bottom coil element 101B is in contact with the bottom surface 157 of the holder cover 153.

In some embodiments, the holder cover 153 is in a shape similar to an annular cylinder shape. For example, the holder cover 153 may define/comprise a holder cover central opening that is positioned at the center of the holder cover 153. In some embodiments, the holder cover central opening is in a shape similar to a circular shape. In some embodiments, the center of the holder cover central opening overlaps with the center of the holder cover 153. An example holder cover central opening 125 of the holder cover 153 is illustrated in FIG. 1D.

In some embodiments, the holder cover central opening 125 defines/comprises an inner periphery surface of the holder cover 153. In some embodiments, the holder cover 153 comprises a plurality of holder cover threads 127 disposed on the inner periphery surface of the holder cover 153. For example, the plurality of holder cover threads 127 is in the form of internal threads (also referred to as female threads) that are on the inside of the holder cover 153. In such an example, the holder cover central opening 125 of the holder cover 153 is in the form of a threaded through-hole that provides the plurality of holder cover threads 127.

As shown in FIG. 1C and FIG. 1D, the example multi-focus-position lens apparatus 100 comprises a rear overtravel stop nut 129. In some embodiments, the rear overtravel stop nut 129 is in a shape similar to an annular cylinder shape. For example, the rear overtravel stop nut 129 may define/comprise a rear overtravel stop nut central opening that is positioned at the center of the rear overtravel stop nut 129. In some embodiments, the rear overtravel stop nut central opening is in a shape similar to a circular shape. In some embodiments, the center of the rear overtravel stop nut central opening overlaps with the center of the rear overtravel stop nut 129. An example rear overtravel stop nut central opening 131 of the rear overtravel stop nut 129 is illustrated in FIG. 1D.

In some embodiments, the rear overtravel stop nut 129 comprises an outer periphery surface. In some embodiments, the rear overtravel stop nut 129 comprises a plurality of rear overtravel stop nut threads 133 that are disposed on the outer periphery surface of the rear overtravel stop nut 129. For example, the plurality of rear overtravel stop nut threads 133 may be in the form of external threads (also referred to as male threads) that are on the outer surface of the rear overtravel stop nut 129.

In some embodiments, the plurality of rear overtravel stop nut threads 133 of the rear overtravel stop nut 129 engages with the plurality of holder cover threads 127 of the holder cover 153, so that the rear overtravel stop nut 129 is secured to the holder cover 153. For example, to secure the rear overtravel stop nut 129 to the holder cover 153, the rear overtravel stop nut 129 may be positioned within the holder cover central opening 125 of the holder cover 153, and the plurality of rear overtravel stop nut threads 133 of the rear overtravel stop nut 129 may mate with the plurality of holder cover threads 127 of the holder cover 153.

As described above, the example multi-focus-position lens apparatus 100 comprises the module holder 135. In some embodiments, the holder cover 153 is secured to the module holder 135. For example, as shown in FIG. 1D, the module holder 135 comprises a rear end, and the holder cover 153 is secured to the rear end of the module holder 135.

In some embodiments, the module holder 135 comprises a front wall that defines/comprises a module holder central opening. In some embodiments, the module holder central opening is in a shape similar to a circular shape. In some embodiments, the center of the module holder central opening overlaps with the central axis of the module holder 135. An example module holder central opening 137 of the module holder 135 is illustrated in FIG. 1D.

In some embodiments, the module holder central opening 137 defines/comprises an inner periphery surface of the module holder 135. In some embodiments, the module holder 135 comprises a plurality of module holder threads 139 disposed on the inner periphery surface of the module holder 135. For example, the plurality of module holder threads 139 may be in the form of internal threads (also referred to as female threads) that are on the inside of the module holder 135. In such an example, the module holder central opening 137 of the module holder 135 is in the form of a threaded through-hole that provides the plurality of module holder threads 139.

As shown in FIG. 1C and FIG. 1D, the example multi-focus-position lens apparatus 100 comprises a front overtravel stop nut 141. In some embodiments, the front overtravel stop nut 141 is in a shape similar to an annular cylinder shape. For example, the front overtravel stop nut 141 may define/comprise a front overtravel stop nut central opening that is positioned at the center of the front overtravel stop nut 141. In some embodiments, the front overtravel stop nut central opening is in a shape similar to a circular shape. In some embodiments, the center of the front overtravel stop nut central opening overlaps with the center of the front overtravel stop nut 141. An example front overtravel stop nut central opening 143 of the front overtravel stop nut 141 is illustrated in FIG. 1D.

In some embodiments, the front overtravel stop nut 141 comprises an outer periphery surface. In some embodiments, the front overtravel stop nut 141 comprises a plurality of front overtravel stop nut threads 145 that are disposed on the outer periphery surface of the front overtravel stop nut 141. For example, the plurality of front overtravel stop nut threads 145 may be in the form of external threads (also referred to as male threads) that are on the outer surface of the front overtravel stop nut 141.

In some embodiments, the plurality of front overtravel stop nut threads 145 of the front overtravel stop nut 141 engages with the plurality of module holder threads 139 of the module holder 135, so that the front overtravel stop nut 141 is secured to the module holder 135. For example, to secure the front overtravel stop nut 141 to the module holder 135, the front overtravel stop nut 141 may be positioned within the module holder central opening 137 of the module holder 135, and the plurality of front overtravel stop nut threads 145 of the front overtravel stop nut 141 may mate with the plurality of module holder threads 139 of the module holder 135.

As shown in FIG. 1C and FIG. 1D, the barrel lens assembly 111 is at least partially positioned within the module holder 135. In some embodiments, the barrel lens assembly 111 comprises a lens aperture 121. In some embodiments, the lens aperture 121 defines/comprises one or more aperture holes, aperture openings, and/or aperture structures where light can travel through. In the example shown in FIG. 1C, the lens aperture 121 defines a front aperture opening 159. For example, light may travel through the front aperture opening 159. The lens aperture 121 also defines a rear aperture opening 165. For example, light may exit from the barrel lens assembly 111 through the rear aperture opening 165. In some embodiments, the front aperture opening 159 is connected to the rear aperture opening 165. In some embodiments, the diameter of the front aperture opening 159 is different from the diameter of the rear aperture opening 165. For example, the diameter of the front aperture opening 159 may be larger than the diameter of the rear aperture opening 165.

In some embodiments, the barrel lens assembly 111 comprises at least one lens element 117 secured within the lens aperture 121. For example, the at least one lens element 117 is secured within the front aperture opening 159. As described above, the at least one lens element 117 defines/provides an optical axis 119 that passes through the center of the at least one lens element 117. In some embodiments, the optical axis 119 defines/illustrates a path along which light propagates through the barrel lens assembly 111.

In the example shown in FIG. 1C, the coil magnetic axis 107 is in a perpendicular arrangement with the optical axis 119. In such an example, the central axis of the coil elements 101A, 101B is perpendicular to the central axis of the barrel lens assembly 111.

In some embodiments, the barrel lens assembly 111 comprises a lens barrel 123. In some embodiments, the lens barrel 123 provides a shell or a housing for various components of the barrel lens assembly 111. For example, as shown in FIG. 1C, the lens aperture 121 is positioned within the lens barrel 123. In some embodiments, the lens barrel 123 defines/comprises one or more holes, openings, and/or aperture structures that correspond to the one or more holes, openings, and/or aperture structures of the lens aperture 121. In the example shown in FIG. 1C, the lens barrel 123 defines a front barrel opening 167 and a rear barrel opening 169. For example, the front aperture opening 159 is within the front barrel opening 167, and the rear aperture opening 165 is within the rear barrel opening 169. In some embodiments, the diameter of the front barrel opening 167 is different from the diameter of the rear barrel opening 169. For example, the diameter of the front barrel opening 167 may be larger than the diameter of the rear barrel opening 169, similar to those described above. In some embodiments, the diameter of the front barrel opening 167 is larger than the diameter of the front aperture opening 159. In some embodiments, the diameter of the rear barrel opening 169 is larger than the diameter of the rear aperture opening 165.

In some embodiments, the barrel lens assembly 111 comprises a top magnetic element 113 secured on a top portion of the barrel lens assembly 111 and a bottom magnetic element 115 secured on a bottom portion of the barrel lens assembly 111. In the example shown in FIG. 1C, the top magnetic element 113 is secured/attached to a top surface of the lens barrel 123, and the bottom magnetic element 115 is secured/attached to a bottom surface of the lens barrel 123. In some embodiments, each of the top magnetic element 113 and the bottom magnetic element 115 comprise a magnet.

In some embodiments, the positions of the top magnetic element 113 and the bottom magnetic element 115 are symmetric with respect to the optical axis 119. For example, a distance from the top magnetic element 113 to the optical axis 119 is the same as a distance from the bottom magnetic element 115 to the optical axis 119.

In some embodiments, the positions of the top coil element 101A and the bottom coil element 101B are symmetric with respect to the optical axis 119. For example, a distance from the top coil element 101A to the optical axis 119 is the same as a distance from the bottom coil element 101B to the optical axis 119.

In the example shown in FIG. 1C, the top magnetic element 113 is positioned just under the top coil element 101A, and the bottom magnetic element 115 is positioned just above the bottom coil element 101B. In some embodiments, the top coil element 101A and the bottom coil element 101B may generate magnetic fields that attract, respectively, the top magnetic element 113 and the bottom magnetic element 115 and cause the top magnetic element 113 and the bottom magnetic element 115 to move relative to the coil magnetic axis 107.

The top magnetic element 113 and the bottom magnetic element 115 each have a north pole ("N") and a south pole ("S"). In the example shown in FIG. 1C, the top magnetic element 113 is positioned with its north pole toward the front of the barrel lens assembly 111 and its south pole toward the rear of the barrel lens assembly 111, while the bottom magnetic element 115 is positioned with its south pole toward the front of the barrel lens assembly 111 and its north pole toward the rear of the barrel lens assembly 111.

As described further below, the coil elements 101A, 101B are powered to cause production of a magnetic field from the coil elements 101A, 101B. The magnetic field from the top coil element 101A acts on the top magnetic element 113 and the magnetic field from the bottom coil element 101B acts on the bottom magnetic element 115 to cause movement of the barrel lens assembly 111 forward or rearward. The amount of movement corresponds to the magnitude of the current through the coil elements 101A, 101B, while the direction of the movement corresponds to the polarity of the current through the coil elements 101A, 101B.

As described above, the top magnetic element 113 and the bottom magnetic element 115 are secured to the barrel lens assembly 111. As such, when the top magnetic element 113 and/or the bottom magnetic element 115 moves (due to the magnetic fields produced by the coil elements 101A, 101B), the barrel lens assembly 111 moves together with the top magnetic element 113 and/or the bottom magnetic element 115.

In some embodiments, the movements of the barrel lens assembly 111 is facilitated by a plurality of bearing balls (typically at least four for stable axial movement). As shown in FIG. 1D, a plurality of moving balls are positioned between the outer surface of the barrel lens assembly 111 and the inner surface of the module holder 135. In particular, the barrel lens assembly 111 comprises at least one bearing ball holding portion (for example, the bearing ball holding portion 149 and the bearing ball holding portion 161) disposed on an outer surface of the barrel lens assembly 111. In particular, the at least one bearing ball holding portion (for example, the bearing ball holding portion 149 and the bearing ball holding portion 161) is a portion of the outer surface of the barrel lens assembly 111 that is sunken from its surrounding portions on the outer surface and/or defines a surface where a bearing ball may be positioned. In the example shown in FIG. 1D, the at least one bearing ball holding portion (for example, the bearing ball holding portion 149 and the bearing ball holding portion 161) is in the form of a groove that is along an edge of the outer surface of the barrel lens assembly 111. As described above, at least one bearing ball is positioned on the at least one bearing ball holding portion. In the example shown in FIG. 1D, at least one bearing ball 151 is positioned on the bearing ball holding portion 149, and at least one bearing ball 163 is positioned on the bearing ball holding portion 161.

In some embodiments, the barrel lens assembly 111 comprises more than one bearing ball holding portion. In the example shown in FIG. 1D, the barrel lens assembly 111 comprises four bearing ball holding portions that are located at the four front outer edges of the barrel lens assembly 111 (including a front top left edge, a front top right edge, a front bottom left edge, and a front bottom right edge), and four bearing ball holding portions that are located at the four rear outer edges of the barrel lens assembly 111 (including a rear top left edge, a rear top right edge, a rear bottom left edge, and a rear bottom right edge). While FIG. 1D illustrates an example of eight bearing ball holding portions, it is noted that the scope of the present disclosure is not limited to the description above. In some examples, an example barrel lens assembly 111 comprises less than eight or more than eight bearing ball holding portions.

Further, as shown in FIG. 1D, the module holder 135 comprises at least one bearing ball moving rail 147 disposed on an inner surface of the module holder 135. In particular, the at least one bearing ball moving rail 147 is a portion of the inner surface of the module holder 135 that is sunken from its surrounding portions on the inner surface and/or defines a rail where a bearing ball may move. In the example shown in FIG. 1D, the at least one bearing ball moving rail 147 is in the form of a groove that is along an edge of the inner surface of the module holder 135.

In some embodiments, the module holder 135 comprises more than one bearing ball moving rail. For example, the module holder 135 comprises four bearing ball moving rails that are located at the four inner edges within the module holder 135 (including a top left edge, a top right edge, a bottom left edge, and a bottom right edge). Additionally, or alternatively, an example barrel lens assembly 111 may comprise less than four or more than four bearing ball moving rails.

As described above, the module holder 135 may house the barrel lens assembly 111. In some embodiments, when the barrel lens assembly 111 is positioned with the module holder 135, the at least one bearing ball holding portion of the barrel lens assembly 111 mates with the at least one bearing ball moving rail of the module holder 135, so that the at least one bearing ball holding portion and the at least one bearing ball moving rail define a space where the at least one bearing ball may be stored, rotate, and move. For example, the at least one bearing ball is moveable along the at least one bearing ball moving rail. As such, the barrel lens assembly 111 is movable within the module holder 135 as the at least one bearing ball moves along the at least one bearing ball moving rail.

Figure 1E:
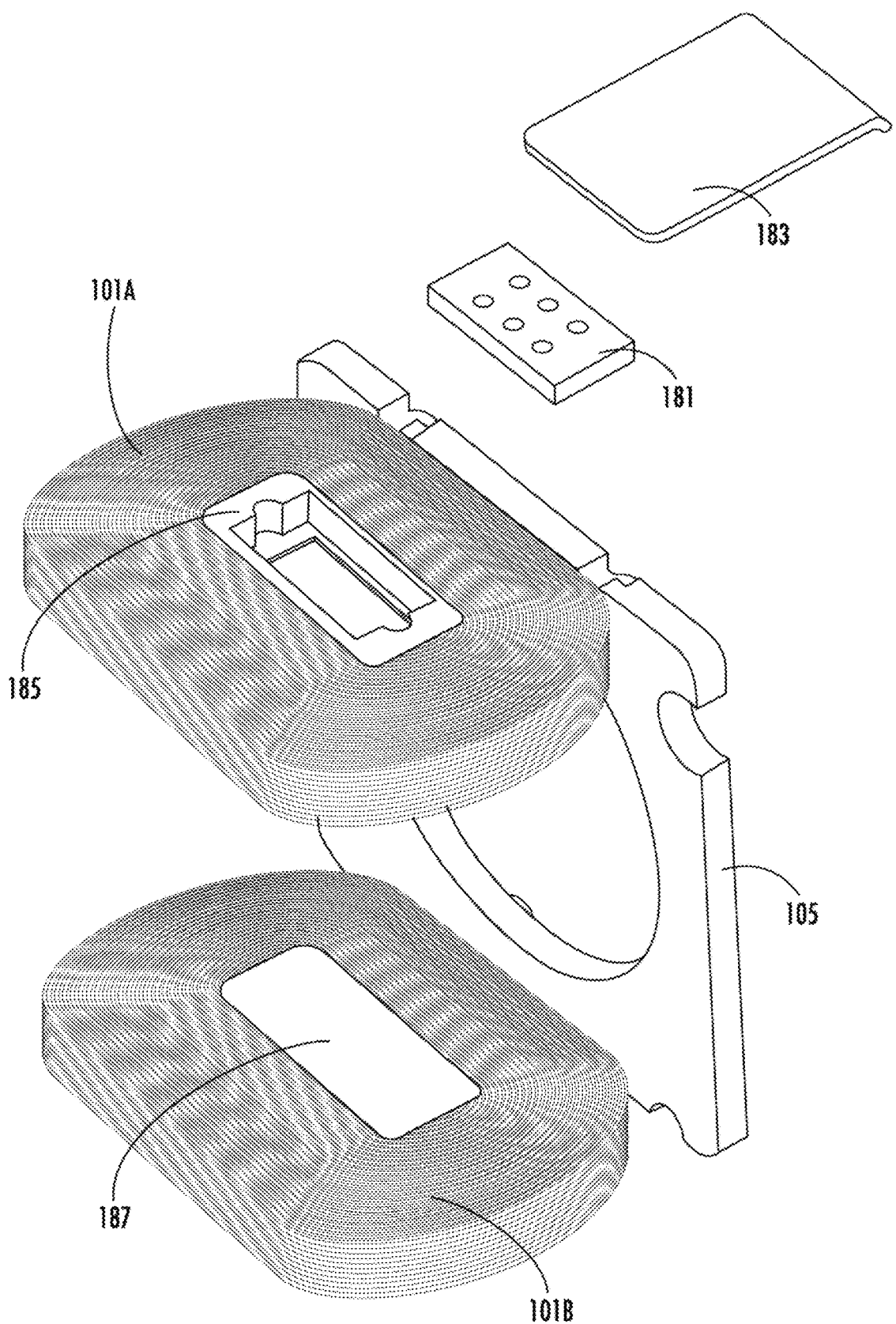
FIG. 1E illustrates an example front perspective view of an example coil assembly of the example multi-focus-position lens apparatus shown in FIG. 1A, in accordance with various embodiments of the present disclosure.

As shown in FIGS. 1D and 1E, in some embodiments a positioning coil assembly 109 comprises a positioning coil board 105, a top coil element 101A, and a bottom coil element 101B. In some embodiments, the positioning coil board 105 is in the form of a printed circuit board (PCB). For example, the positioning coil board 105 may comprise non-conductive substrate materials with layers of copper circuitry that is buried internally or disposed on the external surface. In some embodiments, the copper circuitry may connect one or more electronic components of the example multi-focus-position lens apparatus 100 to one or more other electronic components of the example multi-focus-position lens apparatus 100. In some embodiments, the positioning coil board 105 may connect the top coil element 101A and the bottom coil element 101B to one or more coil variable power circuitries, details of which are described herein.

As illustrated for example, the positioning coil board 105 may define/comprise a positioning coil board opening 171 that is positioned at the center of the positioning coil board 105. In some embodiments, the positioning coil board opening 171 is in a shape similar to a circular shape. In some embodiments, the center of the positioning coil board opening 171 overlaps with the center of the positioning coil board 105.

As illustrated for example, the positioning coil assembly 109 includes a top coil element 101A and a bottom coil element 101B, the top and bottom coil elements positioned opposite each other. In some such embodiments, the positioning coil assembly 109 is designed to receive an electrical current applied to power each positioning coil thereof. As illustrated, the positioning coil assembly 109 is designed such that the top coil element 101A of the positioning coil assembly 109 extends over at least a portion of the top space of the module holder 135, for example to interact with a top magnetic element 113 of the barrel lens assembly 111. Similarly as illustrated, the positioning coil assembly 109 is designed such that the bottom coil element 101B of the positioning coil assembly 109 extends over at least a portion of the bottom space of the module holder 135, for example to interact with a bottom magnetic element 115 of the barrel lens assembly 111.

In some embodiments, the top coil element 101A is secured to/connected to the positioning coil board 105 at a top end of the front surface of the positioning coil board 105, while the bottom coil element 101B is secured to/connected to the positioning coil board 105 at a bottom end of the front surface of the positioning coil board 105.

As described above, each of the coil elements 101A, 101B comprises an electrical conductor (such as a current carrying wire) that is wound, with one or more turns, into a circular or cylindrical shape. In some embodiments, each of the coil elements 101A, 101B comprises the same material, such as, but not limited to, copper wire, coated copper wire, tinned wire, and/or the like.

In some embodiments, the coil direction of the top coil element 101A is the same as the coil direction of the bottom coil element 101B. For example, coils in the top coil element 101A may be wound clockwise when the top coil element 101A is viewed from the top down, and coils in the bottom coil element 101B may be wound counter-clockwise when the bottom coil element 101B is viewed from the top down. Alternatively, coils in the top coil element 101A may be wound counter-clockwise when the top coil element 101A is viewed from the top down, and coils in the bottom coil element 101B may be wound clockwise when the bottom coil element 101B is viewed from the top down.

As illustrated, in some embodiments each of the coil elements 101A, 101B defines a coil inner region comprising an open space between the wire coil. In this regard, the positioning coil assembly 109 may include a positioning pad located in the coil inner region for each of the coil elements 101A, 101B. Specifically, as illustrated, a top positioning pad 185 is located in a first coil inner region of the top coil element 101A. Additionally, a bottom positioning pad 187 is located in a coil inner region of the bottom coil element 101B. In this regard, each of the top positioning pad 185 and the bottom positioning pad 187 comprises particular volumetric dimensions specific to fit within the inner region defined by the corresponding positioning coil.

In some embodiments, each of the positioning pads 185, 187 comprises a component of a ferrous material. For example, in some embodiments, each of the positioning pads 185, 187 comprise a mass of iron, or majority iron, designed to fit within the coil inner region of the corresponding positioning coil. In this regard, each of the positioning pads 185, 187 is configured to interact with one or more magnetic elements of a multi-focus-position lens apparatus when assembled, such as where the positioning magnetic elements of a lens barrel assembly are aligned with each of the positioning pads 185, 187 when each of the coil elements 101A, 101B are in a non-powered state.

In some embodiments, each of the positioning pads 185, 187 is secured within the coil inner region using any of a myriad of manners. For example, in some embodiments, one or more for the positioning pads 185, 187 is secured using one or more adhesives. Additionally or alternatively, in some embodiments, each coil inner region is defined by a coil frame. In some such embodiments, each coil frame may be molded entirely and/or partially around the corresponding positioning pad of the positioning pads 185, 187 to secure the corresponding positioning pad. In some such embodiments, the coiled wire is wound around the coil frame.

As illustrated, the top coil element 101A is located opposite the bottom coil element 101B. Similarly in this regard, the top positioning pad 185 is located opposite the bottom positioning pad 187. Accordingly, the top positioning pad 185 may interact with the top magnetic element 113 of the barrel lens assembly 111. Similarly, the bottom positioning pad 187 may interact with the bottom magnetic element 115 of the barrel lens assembly 111. The positioning pads 185, 187 interact, respectively, with the top and bottom magnetic elements 113, 115 to maintain and/or cause adjusting of the position of the barrel lens assembly 111 within a module holder 135. For example, in at least one example context, when the coil elements 101A, 101B are in a non-powered state, the magnetic attraction between the top positioning pad 185 and the top magnetic element 113 and between the bottom positioning pad 187 and the bottom magnetic element 115 will cause the barrel lens assembly 111 to move to and/or be retained in a default or neutral position.

In some embodiments, the top coil element 101A is powered to a first powered state to generate a first magnetic field, and the bottom coil element 101B is powered to a second powered state to generate a second magnetic field. This resulting magnetic force interacts with the magnetic elements 113, 115 to move the barrel lens assembly 111 to a new focus position, as described herein, based on the resulting magnetic force.

As illustrated, in some embodiments the top positioning pad 185 defines an opening for receiving an electronic component 181. In some embodiments, the electronic component 181 comprises a controller for controlling the movement of the barrel lens assembly 111, a temperature sensor for detecting the temperature within the module holder 135, and a magnetic field sensor for detecting the magnetic field within the module holder 135. As illustrated, in some embodiments a flexible circuit board 183 provides the necessary electrical connections to the electronic component 181. In some alternative embodiments, the bottom positioning pad 187 defines an opening for receiving the electronic component 181. In some alternative embodiments, the controller, the temperature sensor, and/or the magnetic field sensor may be mounted in one or more alternative locations within an example multi-focus-position lens apparatus.

In some embodiments, either the top positioning pad 185 or the bottom positioning pad 187 may define an opening to receive the electronic component, which includes the magnetic field sensor. There are multiple benefits to positioning the magnetic field sensor with the positioning pad. As an iron core, the function of the positioning pad is to concentrate magnetic field strength. Positioning the magnetic field sensor perpendicular with the concentrated magnetic field improves detection sensitivity of the magnetic field. This location of the magnetic field sensor also provides for a more compact form factor/size.

In some embodiments, when example multi-focus-position lens apparatus 100 is assembled, the front overtravel stop nut central opening 143, the module holder central opening 137, the holder cover central opening 125, the rear overtravel stop nut central opening 131, and the positioning coil board opening 171 are aligned with one another. For example, the central axis of the front overtravel stop nut central opening 143, the central axis of the module holder central opening 137, the central axis of the holder cover central opening 125, the central axis of the rear overtravel stop nut central opening 131, and the central axis of the positioning coil board opening 171 may be substantially aligned with the optical axis of the barrel lens assembly 111, such that light may enter the barrel lens assembly 111 after traveling through the front overtravel stop nut central opening 143 and the module holder central opening 137, and may exit the barrel lens assembly 111 and travel through the holder cover central opening 125, the rear overtravel stop nut central opening 131, and the positioning coil board opening 171 (for example, before arriving at an imaging sensor).

In some embodiments, the barrel lens assembly 111 may define a focal point on the optical axis where the light may meet after traveling through the barrel lens assembly 111. In some embodiments, a sensing area of the imaging sensor may be aligned to the positioning coil board opening 171 to capture image data. In some embodiments, the barrel lens assembly 111 may be moved to a suitable barrel lens assembly position along the optical axis so that the location of the focal point of the barrel lens assembly 111 is at the sensing area of the imaging sensor and the image captured by the imaging sensor is in focus. Example methods of causing the barrel lens assembly 111 to move to different barrel lens assembly positions are described herein.

Figure 1F:
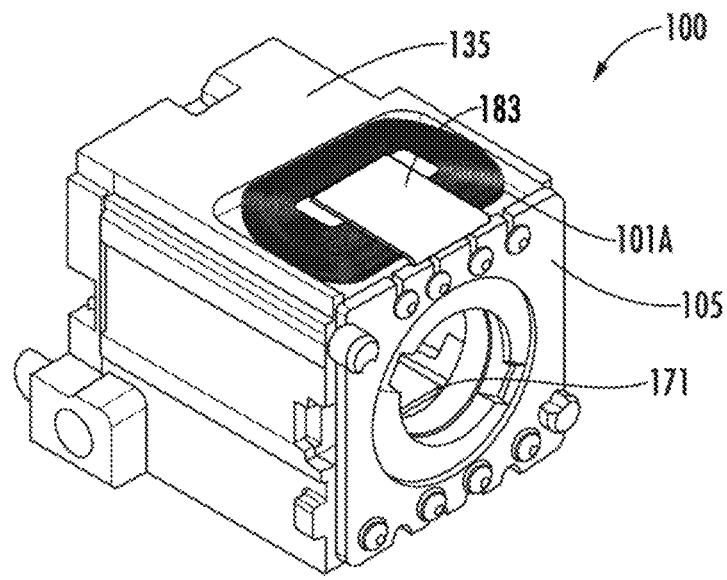
FIG. 1F illustrates an example rear perspective view of the example multi-focus-position lens apparatus shown in FIG. 1A, in accordance with various embodiments of the present disclosure.

Referring now to FIG. 1F, an example rear perspective view of the example multi-focus-position lens apparatus 100 is illustrated. For example, FIG. 1F illustrates that the example positioning coil board opening 171 is positioned at the center of the positioning coil board 105. FIG. 1F also illustrates that the top coil element 101A is positioned along the top surface of the module holder 135.

Figure 1G:
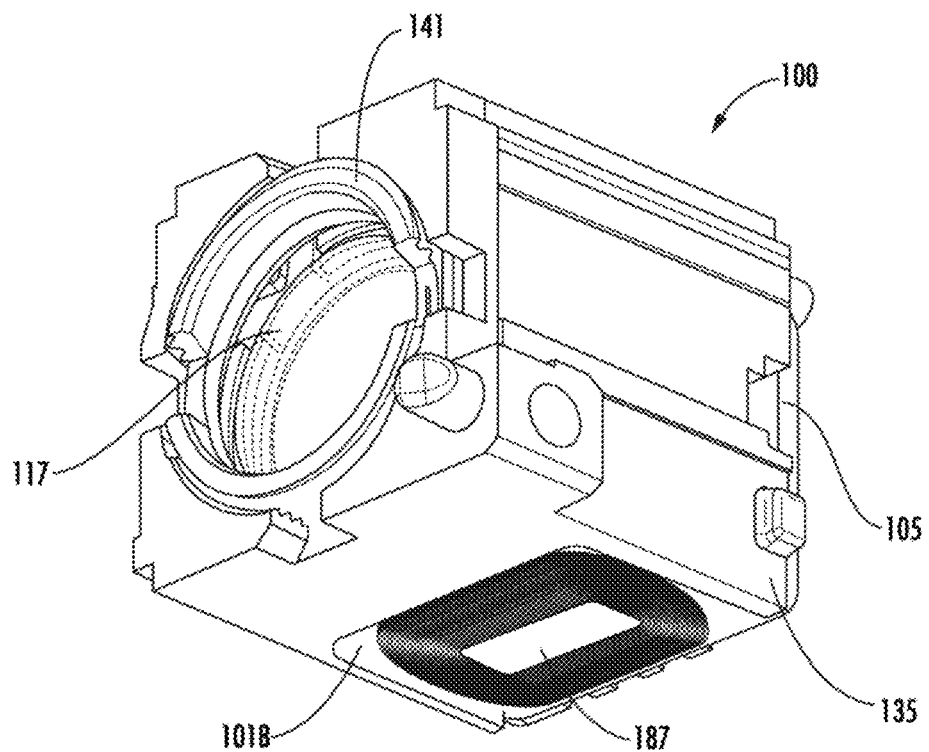
FIG. 1G illustrates an example bottom perspective view of the example multi-focus-position lens apparatus shown in FIG. 1A, in accordance with various embodiments of the present disclosure.

Referring now to FIG. 1G, an example bottom perspective view of the example multi-focus-position lens apparatus 100 is illustrated. For example, FIG. 1G illustrates that the bottom coil element 101B is positioned along the bottom surface of the module holder 135.

Referring now to FIG. 2A to FIG. 2F, example views associated with an example barrel lens assembly 200 in accordance with some embodiments of the present disclosure are illustrated.

Figure 2A:
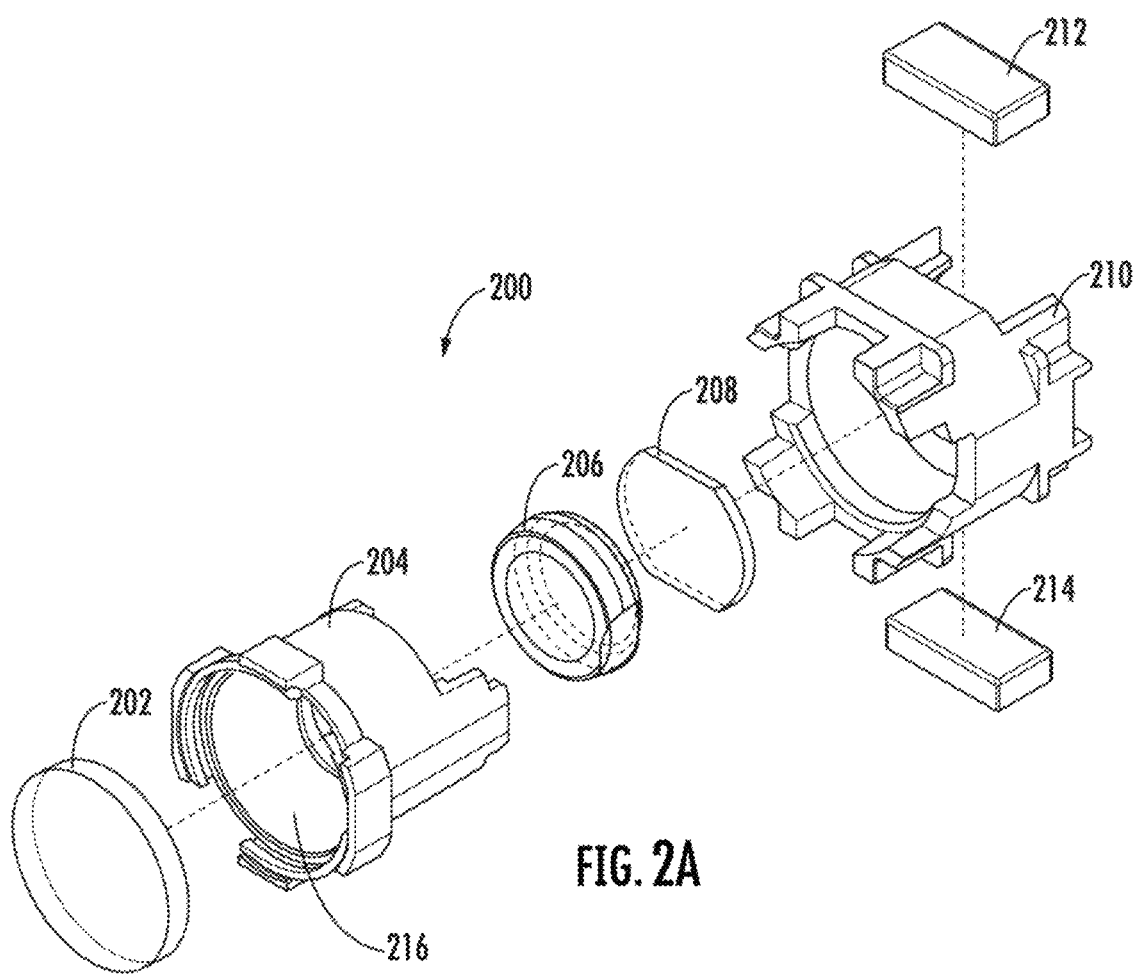
FIG. 2A illustrates an example exploded view of an example barrel lens assembly of an example multi-focus-position lens apparatus, in accordance with some embodiments of the present disclosure.

In particular, FIG. 2A illustrates an example exploded view of the example barrel lens assembly 200. In the example shown in FIG. 2A, the example barrel lens assembly 200 comprises one or more optical elements (such as, but not limited to, a first lens element 202, a second lens element 206, an infrared (IR) cut filter 208), a lens aperture 204, a lens barrel 210, and one or more magnetic elements (such as, but not limited to, a top magnetic element 212 and a bottom magnetic element 214).

Similar to those described above, the lens aperture 204 and/or the lens barrel 210 define/comprise one or more aperture holes, aperture openings, and/or aperture structures where light can travel through. In some embodiments, the one or more optical components of the example barrel lens assembly 200 may be positioned within the aperture holes, aperture openings, and/or aperture structures that are defined by the lens aperture 204 and/or the lens barrel 210.

In some embodiments, the example barrel lens assembly 200 comprises a first lens element 202, a second lens element 206, and an IR cut filter 208. In some embodiments, the first lens element 202, the second lens element 206, and the IR cut filter 208 are secured within the example barrel lens assembly 200.

For example, the first lens element 202 and the second lens element 206 are disposed/secured in the aperture opening 216 of the lens aperture 204, and the IR cut filter 208 is disposed/secured in the lens barrel 210. In some embodiments, the lens aperture 204 is positioned within the lens barrel 210. As such, the first lens element 202, the second lens element 206, and the IR cut filter 208 are secured within the lens barrel 210.

In some embodiments, light may travel through the first lens element 202, then through the second lens element 206, and then through the IR cut filter 208.

In some embodiments, the first lens element 202 may be in the form of a bi-convex lens. In some embodiments, the second lens element 206 may be in the form of a negative meniscus lens. In some embodiments, the first lens element 202 and the second lens element 206 may concentrate light entering the lens barrel 210. In some embodiments, the IR cut filter 208 may reflect or block near-infrared wavelengths while passing visible light.

While the description above provides examples of optical components positioned within the aperture opening of the lens aperture 204, it is noted that the scope of the present disclosure is not limited to the description above. In some examples, an example barrel lens assembly may include one or more optical elements for concentrating, refracting, and/or or otherwise manipulating light entering the example barrel lens assembly. For example, the one or more optical elements may comprise a plurality of sub-lenses designed to manipulate, in a desired manner, the light traversing through the aperture. Additionally, or alternatively, the one or more optical elements may be designed to angle light for capture at one or more desired points, such as at a location of an associated imaging sensor. The one or more optical elements may be constructed of any number of materials, for example glass, optical plastic, and/or the like, or a combination thereof. Additionally or alternatively, the one or more optical elements may be constructed of one or more lenses embodying any number of lens designs.

In some embodiments, the example barrel lens assembly 200 comprises a lens barrel 210. As described above, the lens aperture 204 may be positioned within the lens barrel 210. In the example shown in FIG. 2A, a top magnetic element 212 is positioned on a top of the lens barrel 210, and a bottom magnetic element 214 is positioned on a bottom of the lens barrel 210.

Figure 2B:
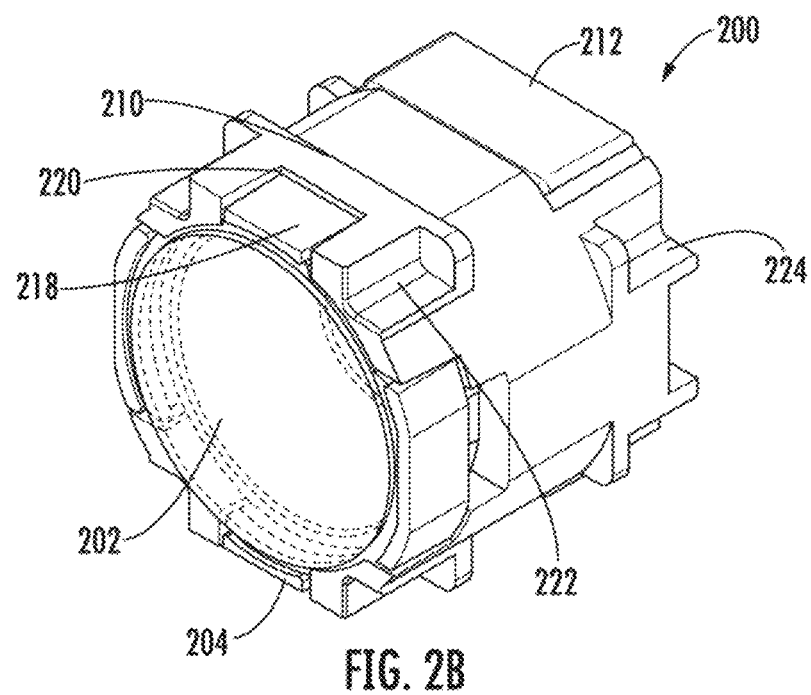
FIG. 2B illustrates an example front perspective view of the example barrel lens assembly shown in FIG. 2A, in accordance with some embodiments of the present disclosure.

FIG. 2B illustrates an example front perspective view of the example barrel lens assembly 200. As shown in FIG. 2B, the lens aperture 204 comprises one or more protrusions (for example, the protrusion 218) that are disposed on the outer surface of the lens aperture 204 and extends from the outer surface of the lens aperture 204. The lens barrel 210 comprises one or more recessed portions (for example, the recessed portion 220). In some embodiments, the one or more protrusions of the lens aperture 204 may mate with the one or more recessed portions of the lens barrel 210, so that the lens aperture 204 can be secured within the lens barrel 210.

Further, as illustrated in FIG. 2B, the example barrel lens assembly 200 comprises at least four bearing ball holding portion (for example but not limited to, the bearing ball holding portion 222 and the bearing ball holding portion 224) disposed on the outer surface of the lens barrel 210. Similar to those described above, each bearing ball holding portion may be in the form of a groove that is disposed along an edge of the outer surface of the lens barrel 210, and at least one bearing ball is positioned on each of the bearing ball holding portions.

Figure 2C:
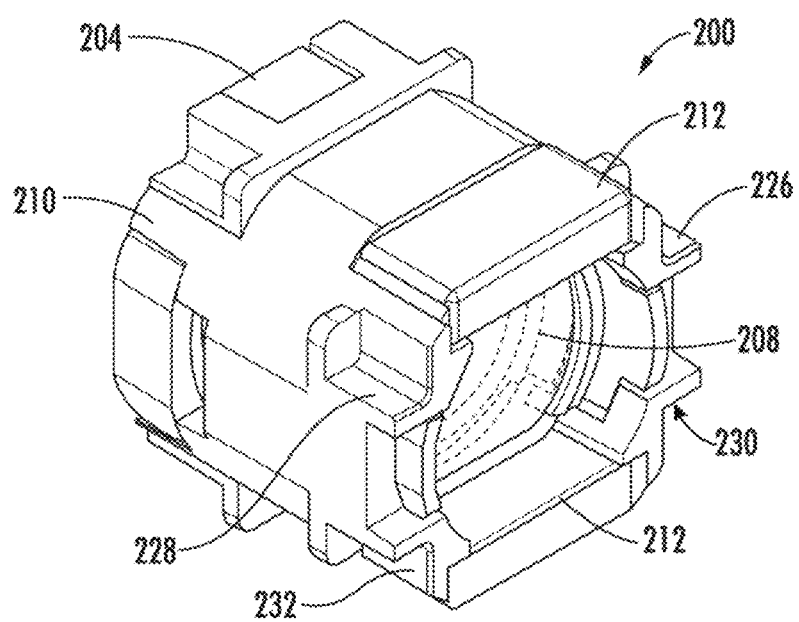
FIG. 2C illustrates an example rear perspective view of the example barrel lens assembly shown in FIG. 2A, in accordance with some embodiments of the present disclosure.

FIG. 2C illustrates an example rear perspective view of the example barrel lens assembly 200. In the example shown in FIG. 2C, the example barrel lens assembly 200 comprises a plurality of recessed edges. In some embodiments, the top magnetic element 212 and the bottom magnetic element 214 are each secured to the example barrel lens assembly 200 through support from a pair of recessed edges. For example, the example barrel lens assembly 200 comprises a top left recessed edge 226 and a top right recessed edge 228 that are disposed on a top portion of the lens barrel 210, and the top left recessed edge 226 is in a parallel arrangement with the top right recessed edge 228. In such an example, the top magnetic element 212 is attached to the top left recessed edge 226 and the top right recessed edge 228. Additionally, or alternatively, the example barrel lens assembly 200 may comprise a bottom right recessed edge 232 and a bottom left recessed edge 230 that are disposed on a bottom portion of the lens barrel 210, and the bottom right recessed edge 232 is in a parallel arrangement with the bottom left recessed edge 230. In such an example, the bottom magnetic element 214 is attached to the bottom right recessed edge 232 and the bottom left recessed edge 230.

Figure 3A:
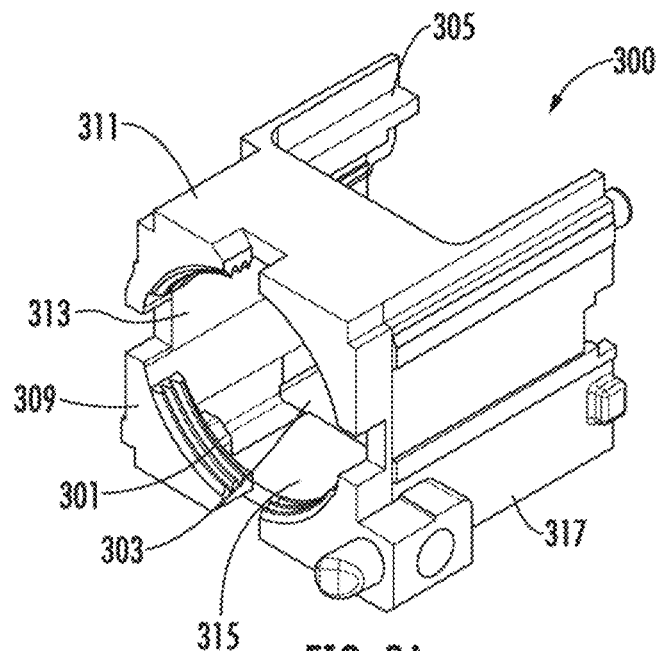
FIG. 3A illustrates an example front perspective view of an example module holder of an example multi-focus-position lens apparatus, in accordance with some embodiments of the present disclosure.
Figure 3B:
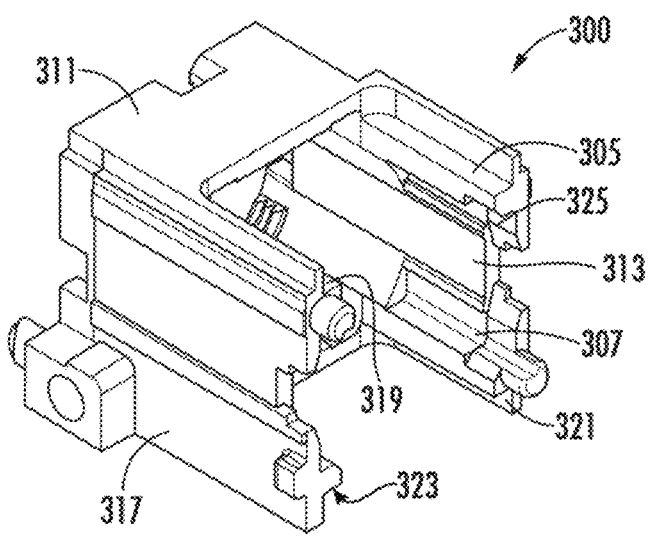
FIG. 3B illustrates an example rear perspective view of the example module holder shown in FIG. 3A, in accordance with some embodiments of the present disclosure.

Referring now to FIG. 3A and FIG. 3B, example views of an example module holder 300 in accordance with some embodiments of the present disclosure are illustrated. In particular, FIG. 3A illustrates an example front perspective view of the example module holder 300. FIG. 3B illustrates an example rear perspective view of the example module holder 300.

Similar to examples of module holders described above, the example module holder 300 may define a module holder central opening 303. For example, the example module holder 300 comprises a front wall 309 that is positioned at a front of the example module holder 300, and the module holder central opening 303 may be disposed at the center of the front wall 309.

In some embodiments, the example module holder 300 comprises a plurality of module holder threads 301 that are disposed on an inner periphery surface of the example module holder 300, similar to those described above.

In some embodiments, the example module holder 300 comprises a top wall 311 that is positioned at the top of the example module holder 300, a bottom wall 315 that is positioned at the bottom of the example module holder 300, a left wall 313 that is positioned at the left of the example module holder 300, and a right wall 317 that is positioned at the right of the example module holder 300.

In some embodiments, a rear portion of the top wall 311 is removed, creating a top left recessed edge 305 on top of the left wall 313 and a top right recessed edge 319 on top of the right wall 317. In some embodiments, a top coil element are disposed on/supported by the top left recessed edge 305 and the top right recessed edge 319.

Similarly, a rear portion of the bottom wall 315 is removed, creating a bottom left recessed edge 321 at the bottom of the left wall 313 and a bottom right recessed edge 323 at the bottom of the right wall 317. In some embodiments, a bottom coil element are disposed on/supported by the bottom left recessed edge 321 and the bottom right recessed edge 323.

Further, as shown in FIG. 3B, the example module holder 300 comprises one or more bearing ball moving rails on the inner surface of the module holder 300. For example, the bearing ball moving rail 307 may be defined between the inner surface of the left wall 313 and the inner surface of the bottom wall 315. Similarly, the bearing ball moving rail 325 may be defined between the inner surface of the top wall 311 and the inner surface of the left wall 313.

An example method of assembling an example multi-focus-position lens apparatus will now be described in accordance with some embodiments of the present disclosure. First, the lens element(s), filter, and magnet elements are secured to the lens barrel. For example, as described above in connection with FIG. 2A, one or more optical components of the example barrel lens assembly 200 may be positioned within the aperture holes, aperture openings, and/or aperture structures that are defined by the lens aperture 204 and/or the lens barrel 210. For example, the first lens element 202, the second lens element 206, and/or the IR cut filter 208 may be secured within the lens aperture 204 and/or the lens barrel 210 through, for example, but not limited to, interference fit. Additionally, or alternatively, the first lens element 202, the second lens element 206, and/or the IR cut filter 208 may be secured within the lens aperture 204 and/or the lens barrel 210 through, for example but not limited to, chemical glues. Additionally, or alternatively, the first lens element 202, the second lens element 206, and/or the IR cut filter 208 may be secured within the lens aperture 204 and/or the lens barrel 210 through other mechanisms.

The example method further includes positioning the barrel lens assembly through the rear opening of the module holder with bearing balls. For example, as described above in connection with FIG. 1D, the module holder 135 comprises a plurality of walls that define a rear opening. As a part of assembling the example multi-focus-position lens apparatus 100, the barrel lens assembly 111 may be positioned through the rear opening of the module holder 135 so that the barrel lens assembly 111 can be positioned within the module holder 135.

Further, as described above, the module holder comprises at least one bearing ball moving rail disposed on an inner surface of the module holder, and the barrel lens assembly comprises at least one bearing ball holding portion disposed on an outer surface of the barrel lens assembly. In some embodiments, assembling the example multi-focus-position lens apparatus comprises positioning at least one bearing ball on the at least one bearing ball holding portion of the barrel lens assembly, and mating the at least one bearing ball holding portion of the barrel lens assembly with the at least one bearing ball moving rail of the module holder, so that the barrel lens assembly is movable within the module holder as the at least one bearing ball moves along the at least one bearing ball moving rail, similar to those described above.

The example method further includes securing a holder cover at the rear end of the module holder. For example, as described above in connection with at least FIG. 1D, the module holder 135 comprises a rear end, and the holder cover 153 is secured to the rear end of the module holder 135 (for example, through chemical glue and/or mechanical locking mechanisms). As described above, the barrel lens assembly is positioned within the module holder. As such, after the holder cover is secured at the rear end of the module holder, the barrel lens assembly (along with the bearing balls) is positioned in front of the holder cover.

The example method further includes securing the rear overtravel stop nut to the holder cover through engaging the rear overtravel stop nut threads with the holder cover threads. As described above, the holder cover may comprise a plurality of holder cover threads disposed on the inner periphery surface of the holder cover. For example, the plurality of holder cover threads may be in the form of internal threads (e.g. female threads) that are on the inside of the holder cover.

The rear overtravel stop nut may comprise a plurality of rear overtravel stop nut threads that are disposed on the outer periphery surface of the rear stop nut. For example, the plurality of rear overtravel stop nut threads may be in the form of external threads (e.g. male threads) that are on the outer surface of the rear stop nut. As such, through engaging the plurality of holder cover threads of the holder cover with the plurality of rear overtravel stop nut threads of the rear stop nut, the rear overtravel stop nut can be secured to the holder cover.

In some embodiments, the position of the rear overtravel stop nut is adjustable based on the amount of mating of the plurality of holder cover threads and the plurality of rear overtravel stop nut threads.

The example method further includes securing the front overtravel stop nut to the module holder through engaging the front overtravel stop nut threads with the module holder threads. As described above, the module holder may comprise a plurality of module holder threads that are disposed on the inner periphery surface of the module holder. For example, the plurality of module holder threads may be in the form of internal threads (e.g. female threads) that are on the inside of the module holder.

The front overtravel stop nut may comprise a plurality of front overtravel stop nut threads that are disposed on the outer periphery surface of the front stop nut. For example, the plurality of front overtravel stop nut threads may be in the form of external threads (e.g. male threads) that are on the outer surface of the front stop nut. As such, through engaging the front overtravel stop nut threads with the module holder threads, the front overtravel stop nut can be secured to the module holder.

In some embodiments, the position of the front overtravel stop nut is adjustable based on the amount of mating of the plurality of module holder threads and the plurality of front overtravel stop nut threads.

The example method further includes securing the top and bottom coil elements to the top and bottom of the module holder. In some embodiments, assembling the example multi-focus-position lens apparatus 100 comprises securing the top coil element 101A to a top portion of the module holder 135, and securing the bottom coil element 101B to a bottom portion of the module holder 135.

For example, as described above in connection with at least FIG. 3A and FIG. 3B, the top coil element may be secured to the top portion of the module holder between the top left recessed edge and the top right recessed edge, and the bottom coil element may be secured to the bottom portion of the module holder between the bottom left recessed edge and the bottom right recessed edge.

The example method further includes securing the positioning coil board to the module holder. For example, the example method may secure the rear portion of the module holder to the front surface of the positioning coil board through screws. Additionally, or alternatively, the example method may secure the rear portion of the module holder to the front surface of the positioning coil board through other means (such as, but not limited to, chemical glues).

As described above, the barrel lens assembly is positioned within the module holder. As such, the barrel lens assembly may be positioned within the housing defined by the module holder and the positioning coil board. For example, the barrel lens assembly may be positioned between the front overtravel stop nut and the rear stop nut, similar to those described above.

Figure 5:
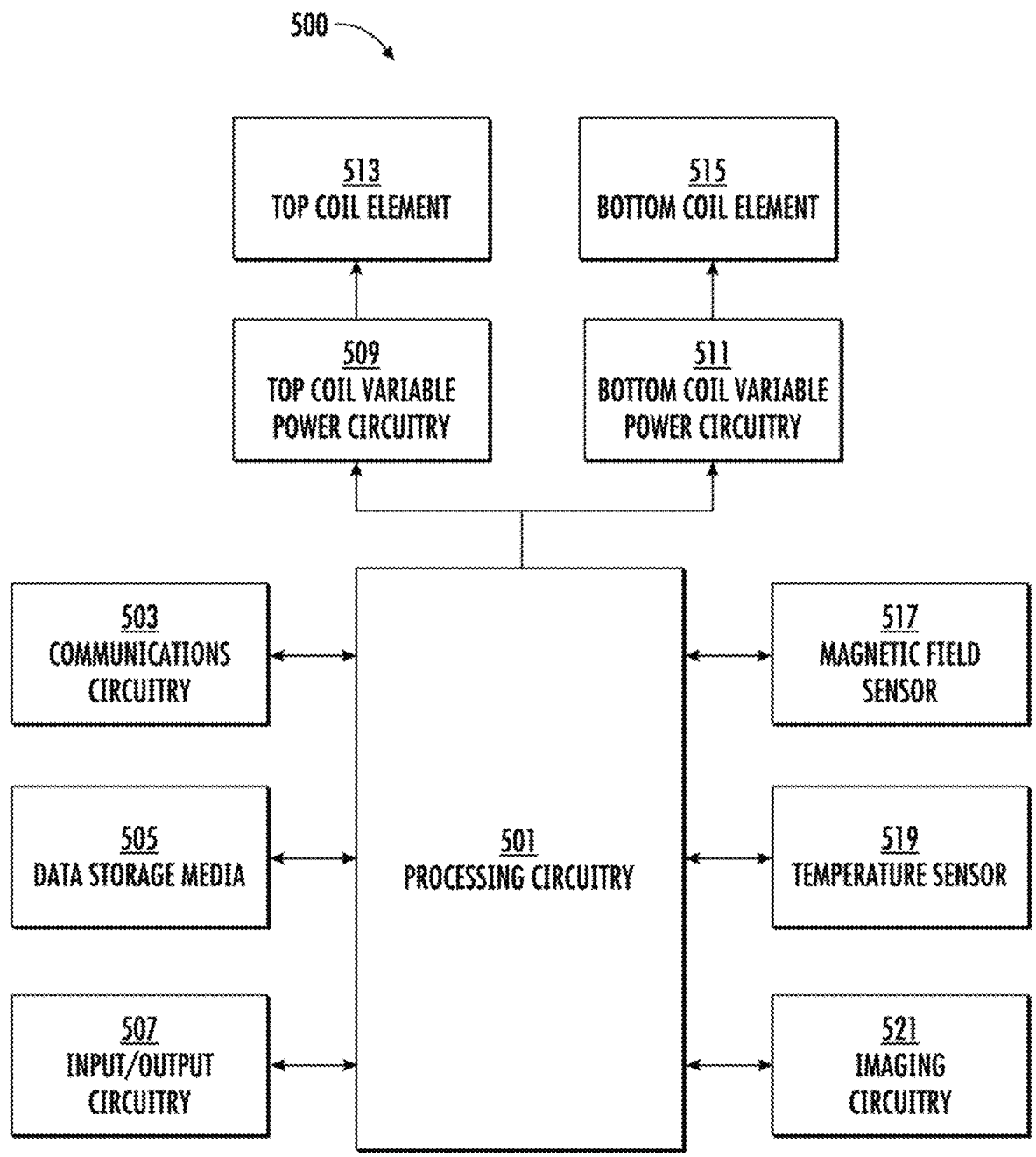
FIG. 5 illustrates an example block diagram showing example components associated with an example multi-focus-position lens apparatus, in accordance with some embodiments of the present disclosure.

FIG. 5 illustrates an example block diagram showing example components associated with an example multi-focus-position lens apparatus 500 in accordance with some embodiments of the present disclosure. In the example shown in FIG. 5, the example multi-focus-position lens apparatus 500 includes a processing circuitry 501, a communications circuitry 503, a data storage media 505, and an input/output circuitry 507. Additionally, the example multi-focus-position lens apparatus 500 comprises a top coil variable power circuitry 509 that is electronically coupled to the top coil element 513 and provides a top coil current to the top coil element 513. Additionally, the example multi-focus-position lens apparatus 500 comprises a bottom coil variable power circuitry 511 that is electronically coupled to the bottom coil element 515 and provides a bottom coil current to the bottom coil element 515. Additionally, the example multi-focus-position lens apparatus 500 comprises a magnetic field sensor 517 for detecting a magnetic field within the lens apparatus and a temperature sensor 519 for detecting a temperature within the lens apparatus. Additionally, the example multi-focus-position lens apparatus 500 comprises an imaging circuitry 521.

In accordance with some embodiments of the present disclosure, the processing circuitry 501 of the example multi-focus-position lens apparatus 500 may be configured to execute the operations described herein. Although the components are described with respect to functional limitations, it should be understood that the particular implementations necessarily include the use of particular hardware. It should also be understood that certain of the components described herein may include similar or common hardware. For example, two sets of circuitries may both leverage use of the same processor, network interface, storage medium, or the like to perform their associated functions, such that duplicate hardware is not required for each set of circuitries.

In some embodiments, the processing circuitry 501 (and/or co-processor or any other processing circuitry assisting or otherwise associated with the processor) is in communication with the data storage media 505 via a bus for passing information among components of the apparatus. The data storage media 505 may be non-transitory and may include, for example, one or more volatile and/or non-volatile memories. In other words, for example, the data storage media 505 may be an electronic storage device (e.g., a computer readable storage medium). The data storage media 505 may be configured to store information, data, content, applications, instructions, or the like, for enabling the example multi-focus-position lens apparatus 500 to carry out various functions in accordance with example embodiments of the present disclosure.

The processing circuitry 501 may be embodied in a number of different ways and may, for example, include one or more processing devices configured to perform independently. For example, the processing circuitry 501 may be embodied as one or more complex programmable logic devices (CPLDs), microprocessors, multi-core processors, co-processing entities, application-specific instruction-set processors (ASIPs), and/or controllers. Further, the processing circuitry 501 may be embodied as one or more other processing devices or circuitry. The term circuitry may refer to an entirely hardware embodiment or a combination of hardware and computer program products. Thus, the processing circuitry 501 may be embodied as integrated circuits, application specific integrated circuits (ASICs), field programmable gate arrays (FPGAs), programmable logic arrays (PLAs), hardware accelerators, other circuitry, and/or the like.

In an example embodiment, the processing circuitry 501 may be configured to execute instructions stored in the data storage media 505 or otherwise accessible to the processing circuitry 501. Alternatively, or additionally, the processing circuitry 501 may be configured to execute hard-coded functionality. As such, whether configured by hardware or software methods, or by a combination thereof, the processing circuitry 501 may represent an entity (e.g., physically embodied in circuitry) capable of performing operations according to an embodiment of the present disclosure while configured accordingly. Alternatively, as another example, when the processing circuitry 501 is embodied as an executor of software instructions, the instructions may specifically configure the processor to perform the algorithms and/or operations described herein when the instructions are executed.

In some embodiments, the example multi-focus-position lens apparatus 500 includes the input/output circuitry 507 that may, in turn, be in communication with the processing circuitry 501 to provide output to the user and, in some embodiments, to receive an indication of a user input. The input/output circuitry 507 may comprise an interface, a mobile application, a kiosk, or the like. In some embodiments, the input/output circuitry 507 may also include a keyboard, a mouse, a joystick, a touch screen, touch areas, soft keys, a microphone, a speaker, or other input/output mechanisms.

In some embodiments, the input/output circuitry 507 may include a display that may, in turn, be in communication with the processing circuitry 501 to display renderings of user interfaces. In various examples of the present disclosure, the display may include a liquid crystal display (LCD), a light-emitting diode (LED) display, a plasma (PDP) display, a quantum dot (QLED) display, and/or the like.

The communications circuitry 503 may be any means such as a device or circuitry embodied in either hardware or a combination of hardware and software that is configured to receive and/or transmit data from/to a network and/or any other device, circuitry, or module in communication with the example multi-focus-position lens apparatus 500. In this regard, the communications circuitry 503 may include, for example, a network interface for enabling communications with a wired or wireless communication network. For example, the communications circuitry 503 may include one or more network interface cards, antennae, buses, switches, routers, modems, and supporting hardware and/or software, or any other device suitable for enabling communications via a network. Additionally, or alternatively, the communication interface may include the circuitry for interacting with the antenna(s) to cause transmission of signals via the antenna(s) or to handle receipt of signals received via the antenna(s).

The magnetic field sensor 517 may be any means such as a device or circuitry embodied in either hardware or a combination of hardware and software that is configured to detect a magnetic field within the example multi-focus-position lens apparatus 500 and provide a magnetic field measurement to the processing circuitry 501. In some example embodiments, the magnetic field sensor 517 comprises a Hall effect sensor.

The temperature sensor 519 may be any means such as a device or circuitry embodied in either hardware or a combination of hardware and software that is configured to detect a temperature within the example multi-focus-position lens apparatus 500 and provide a temperature measurement to the processing circuitry 501. In some example embodiments, the temperature sensor 519 comprises a negative temperature coefficient (NTC) thermistor, a resistance temperature detector (RTD), a thermocouple, or a semiconductor-based temperature sensor.

The imaging circuitry 521 may be any means such as a device or circuitry embodied in either hardware or a combination of hardware and software that is configured to capture an image of a target in a field of view of the example multi-focus-position lens apparatus 500.

It is also noted that all or some of the information discussed herein can be based on data that is received, generated and/or maintained by one or more components of example multi-focus-position lens apparatus 500. In some embodiments, one or more external systems (such as a remote computing and/or data storage system) may also be leveraged to provide at least some of the functionality discussed herein.

In the example shown in FIG. 5, the example multi-focus-position lens apparatus 500 comprises a top coil variable power circuitry 509 connected to the top coil element 513. In some embodiments, the top coil variable power circuitry 509 may provide an adjustable current to the top coil element 513. For example, the top coil variable power circuitry 509 may be in the form of an adjustable current regulator that is coupled to a power source (for example, a direct current (DC) current source). Additionally, or alternatively, the top coil variable power circuitry 509 may be in the form of a variable resistor that is coupled to the power source. Additionally, or alternatively, the top coil variable power circuitry 509 may be in other forms.

In some embodiments, the processing circuitry 501 may transmit control instructions to the top coil variable power circuitry 509 to set the value of the top coil current in the top coil element 513. For example, the control instructions may comprise a value for the top coil current. In some embodiments, in response to receiving the control instructions, the top coil variable power circuitry 509 may adjust the top coil current that flows in the top coil element 513 based on the value for the top coil current indicated in the control instructions.

Similarly, the example multi-focus-position lens apparatus 500 comprises a bottom coil variable power circuitry 511 connected to the bottom coil element 515. In some embodiments, the bottom coil variable power circuitry 511 may provide an adjustable current to the bottom coil element 515. For example, the bottom coil variable power circuitry 511 may be in the form of an adjustable current regulator that is coupled to a power source (for example, a direct current (DC) current source). Additionally, or alternatively, the bottom coil variable power circuitry 511 may be in the form of a variable resistor that is coupled to the power source. Additionally, or alternatively, the bottom coil variable power circuitry 511 may be in other forms.

In some embodiments, the processing circuitry 501 may transmit control instructions to the bottom coil variable power circuitry 511 to set the value of the bottom coil current in the bottom coil element 515. For example, the control instructions may comprise a value for the bottom coil current. In some embodiments, in response to receiving the control instructions, the bottom coil variable power circuitry 511 may adjust the bottom coil current that flows in the bottom coil element 515 based on the value for the bottom coil current indicated in the control instructions.

As such, the processing circuitry 501 may control the amount of the top coil current that powers the top coil element and the amount of the bottom coil current that powers the bottom coil element. In some embodiments, the processing circuitry 501 may cause the barrel lens assembly to move to a plurality of barrel lens assembly positions through current setting (e.g. setting the top coil current and the bottom coil current), details of which are described herein. In some embodiments, the top coil variable power circuitry and the bottom coil variable power circuitry may be combined.

As described above, example embodiments use pre-determined calibration data to determine, using temperature and magnetic field measurement data, a current position of the barrel lens assembly and to determine (for example, using a proportional-integral-derivative (PID) feedback loop) how to modify the coil current to move the barrel lens assembly to the desired focus position. The calibration data comprises corresponding magnetic field values, temperatures, and positions that may be determined, for example, during manufacturing of an example multi-focus-position lens apparatus.

Table 1 below illustrates a subset of example calibration data for an example multi-focus-position lens apparatus (actual calibration data will typically comprise several hundred data points or more). As illustrated, at a plurality of different temperatures (the column headers), different corresponding magnetic field values (the row headers) and distances (the field values) from the neutral position (forward or rearward) are measured and captured. In the example of Table 1, calibration data is captured at seven different temperatures from 0° C. to 60° C. in 10° C. increments, but any suitable temperatures may be used. In Table 1, the magnetic field strength is expressed in Teslas and the distance is expressed in millimeters (positive for distance forward of the neutral position and negative for distance rearward of the neutral position).

In an example calibration process, a plurality of different currents (different magnitudes and different polarities) are applied to the positioning coils and the magnetic field, the temperature, and the distance from the neutral position are measured and recorded. The temperature within an example multi-focus-position lens apparatus will vary based on both the ambient temperature and the current applied to the positioning coils. As such, the ambient temperature is varied during the calibration process to obtain calibration data at a plurality of different temperatures.

In some embodiments, calibration data is obtained not only for the different desired focus positions, but for a variety of other positions before the focus positions (i.e., between the neutral position and the focus position) and after the focus position (i.e., between the focus position and the corresponding overtravel limit). In an example embodiment, there are three desired focus positions: the neutral position (i.e., the position of the barrel lens assembly when no current is applied to the positioning coils, a first position that is forward of the neutral position, and a second position that is rearward of the neutral position. In one specific example embodiment, the first position is 50 microns forward of the neutral position and the second position is 50 microns rearward of the neutral position. The non-neutral positions may be symmetric or non-symmetric to the neutral position. For example, the first position may be 100 microns forward of the neutral position and the second position may be 50 microns rearward of the neutral position. In some embodiment, after the magnetic field, the temperature, and the distance from the neutral position are measured and recorded during the calibration process as described above, the calibration data is filtered to remove data capture noise and sampling error and the remaining data is curve fitted.

TABLE 1

Magnetic strength

|  | 0 C | 10 C | 20 C | 30 C | 40 C | 50 C | 60 C |
|---|---|---|---|---|---|---|---|
| 0.92 | 0.065 | 0.065 | 0.065 | 0.065 | 0.065 | 0.065 | 0.065 |
| 0.93 | 0.065 | 0.065 | 0.065 | 0.065 | 0.065 | 0.064 | 0.06 |
| 0.94 | 0.065 | 0.065 | 0.065 | 0.065 | 0.064 | 0.06 | 0.033 |
| 0.95 | 0.065 | 0.065 | 0.065 | 0.064 | 0.06 | 0.036 | 0.02 |
| 0.96 | 0.064 | 0.064 | 0.063 | 0.06 | 0.037 | 0.023 | 0.01 |
| 0.97 | 0.06 | 0.06 | 0.045 | 0.033 | 0.023 | 0.012 | 0 |
| 0.98 | 0.039 | 0.033 | 0.033 | 0.02 | 0.012 | 0.002 | −0.01 |
| 0.99 | 0.024 | 0.024 | 0.016 | 0.01 | 0.002 | −0.008 | −0.02 |
| 1 | 0.013 | 0.01 | 0.006 | 0 | −0.01 | −0.018 | −0.033 |
| 1.01 | 0.003 | 0 | −0.004 | −0.01 | −0.018 | −0.03 | −0.06 |
| 1.02 | −0.007 | −0.01 | −0.014 | −0.02 | −0.03 | −0.05 | −0.064 |
| 1.03 | −0.017 | −0.02 | −0.024 | −0.033 | −0.05 | −0.063 | −0.065 |
| 1.04 | −0.028 | −0.033 | −0.04 | −0.06 | −0.065 | −0.065 | −0.065 |
| 1.05 | −0.047 | −0.05 | −0.062 | −0.065 | −0.065 | −0.065 | −0.065 |
| 1.06 | −0.065 | −0.065 | −0.065 | −0.065 | −0.065 | −0.065 | −0.065 |

Figure 4A:
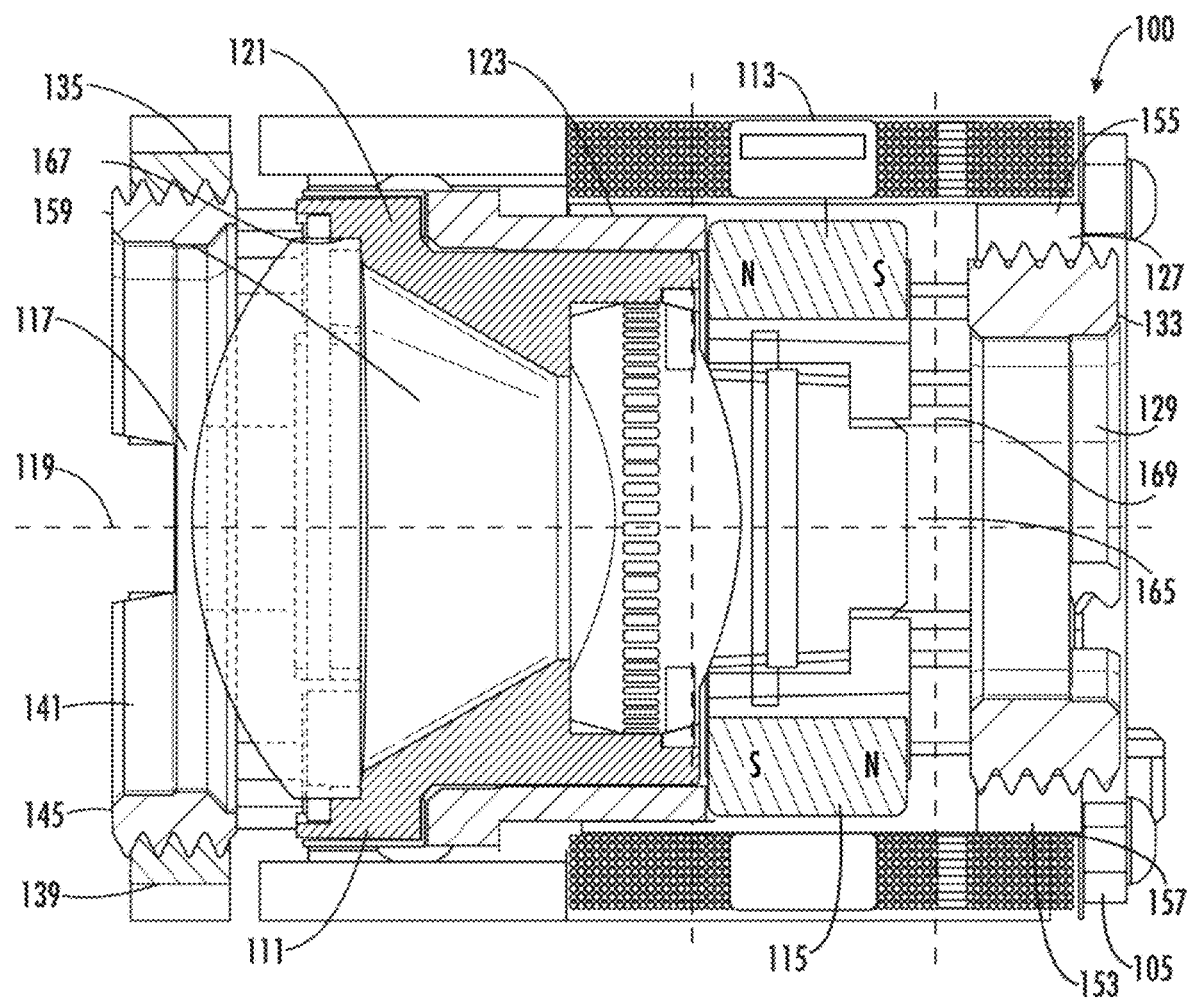
FIG. 4A illustrates an example cross section view showing an example position of the example barrel lens assembly within the example multi-focus-position lens apparatus shown in FIG. 1A, in accordance with various embodiments of the present disclosure.
Figure 4B:
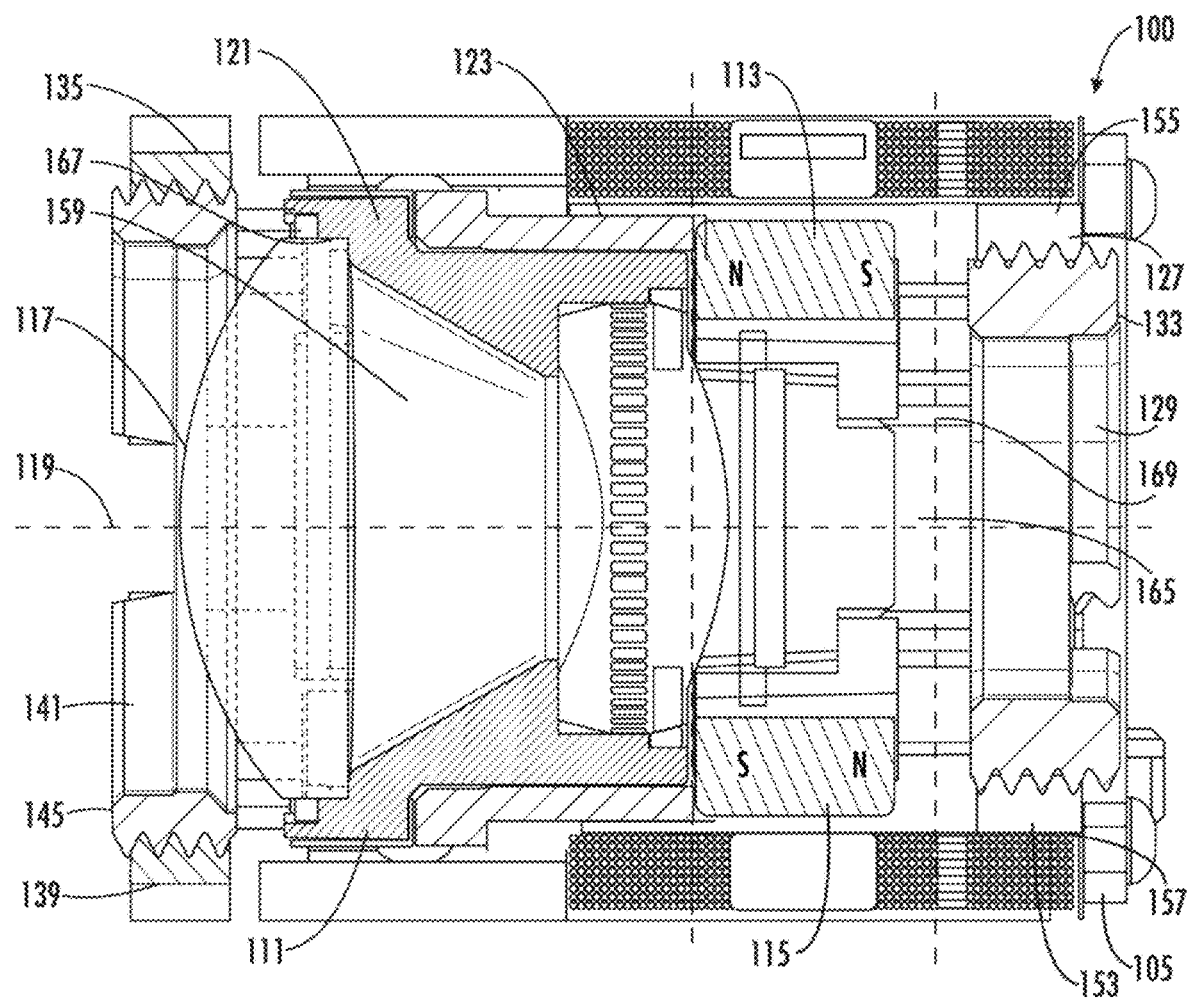
FIG. 4B illustrates an example cross section view showing another example position of the example barrel lens assembly within the example multi-focus-position lens apparatus shown in FIG. 1A, in accordance with various embodiments of the present disclosure.
Figure 4C:
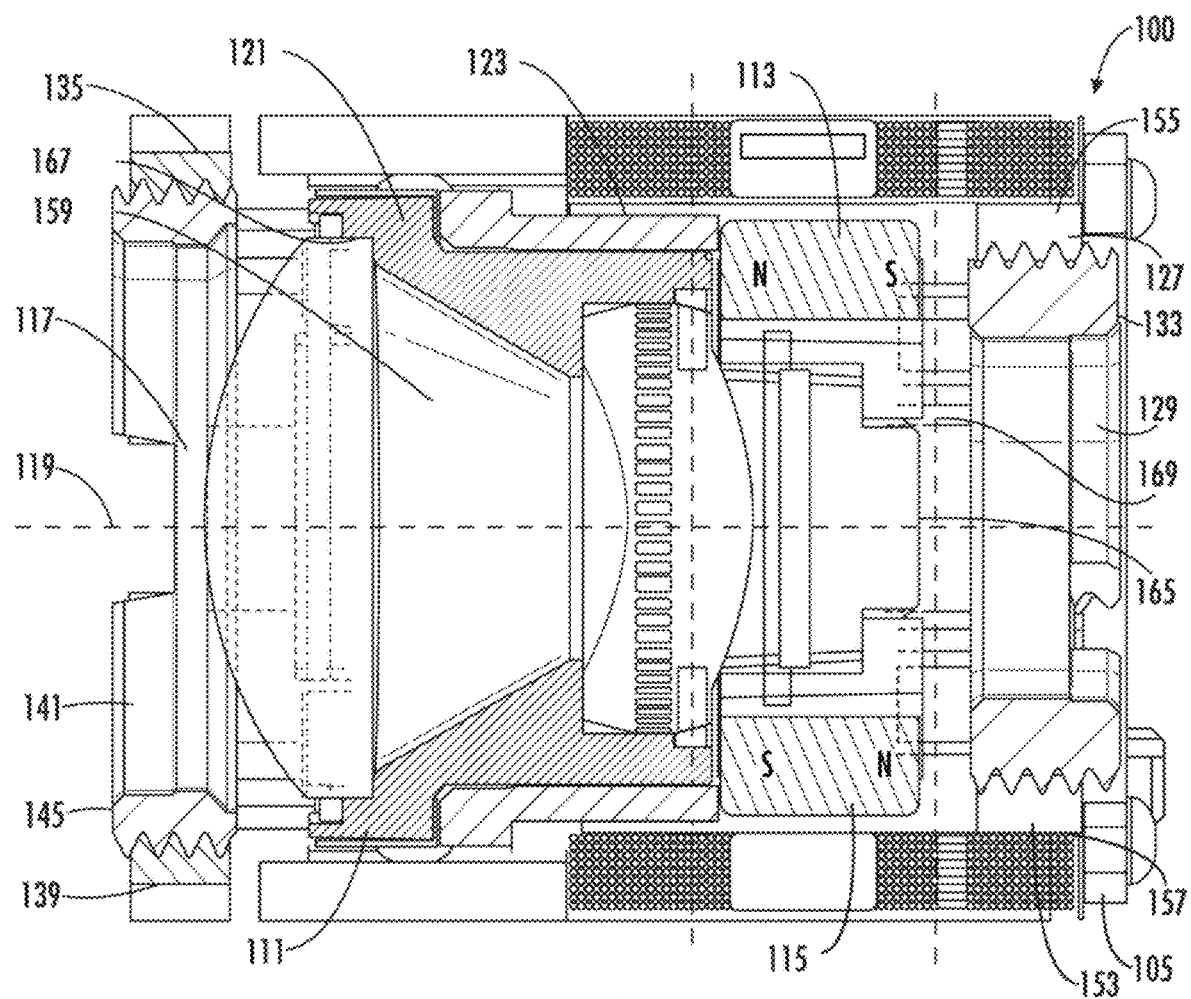
FIG. 4C illustrates an example cross section view showing another example position of the example barrel lens assembly within the example multi-focus-position lens apparatus shown in FIG. 1A, in accordance with various embodiments of the present disclosure.

Referring now to FIG. 4A to FIG. 4C, example cross section views of an example multi-focus-position lens apparatus 100 in accordance with some embodiments of the present disclosure are illustrated. Similar to FIG. 1C described above, the example cross section views shown in FIG. 4A to FIG. 4C illustrate when the example multi-focus-position lens apparatus is cut from line A-A' and viewed in the direction as shown in FIG. 1B.

As shown in FIG. 4A to FIG. 4C, the example multi-focus-position lens apparatus 100 comprises a barrel lens assembly 111 that is positioned within the module holder 135. In some embodiments, the barrel lens assembly 111 is moveable to a plurality of barrel lens assembly positions or focus positions. In some embodiments, the plurality of barrel lens assembly positions correspond to a magnitude and a polarity of the bottom coil current and the top coil current.

In particular, FIG. 4A illustrates an example where the barrel lens assembly position of the example barrel lens assembly 111 is in a neutral position. FIG. 4B illustrates an example where the example multi-focus-position lens apparatus 100 is at a first or forward barrel lens assembly position. FIG. 4C illustrates an example where the example multi-focus-position lens apparatus 100 is at a second or rearward barrel lens assembly position. Although not illustrated, an example barrel lens assembly of an example multi-focus-position lens apparatus may be positionable to more than three positions.

Referring now to FIG. 4A, the example multi-focus-position lens apparatus 100 comprises a top coil element 101A and a bottom coil element 101B, as described above. A top positioning pad 185 is positioned at the center of the top coil element 101A and a bottom positioning pad 187 is positioned at the center of the bottom coil element 101B. A top magnetic element 113 is positioned on the barrel lens assembly 111 below the top coil element 101A and a bottom magnetic element 115 is positioned on the barrel lens assembly 111 above the bottom coil element 101B. In at least one example context, when the coil elements 101A, 101B are in a non-powered state, the magnetic attraction between the top positioning pad 185 and the top magnetic element 113 and between the bottom positioning pad 187 and the bottom magnetic element 115 will cause the barrel lens assembly 111 to move to and/or be retained in a default or neutral position as illustrated in FIG. 4A.

As described above in connection with FIG. 5, a top coil variable power circuitry is electronically coupled to the top coil element 101A and provides a top coil current to the top coil element 101A, and a bottom coil variable power circuitry is electronically coupled to the bottom coil element 101B and provides a bottom coil current to the bottom coil element 101B. In some embodiments, the direction of the magnetic fields produced by the top coil element 101A and the bottom coil element 101B will vary according to the polarity of the current applied. In some embodiments, the top coil element 101A and the bottom coil element 101B are wired such that applying a current having a first polarity to each of the top coil element 101A and the bottom coil element 101B results in production of a magnetic field in which the top surfaces of both the top coil element 101A and the bottom coil element 101B have the same magnetic polarity (either north or south) and the bottom surfaces of both the top coil element 101A and the bottom coil element 101B have the same magnetic polarity (either south or north). Conversely, applying a current having a second, opposite polarity to each of the top coil element 101A and the bottom coil element 101B results in production of an opposite magnetic field in which the top surfaces of both the top coil element 101A and the bottom coil element 101B have the same magnetic polarity (either south or north) and the bottom surfaces of both the top coil element 101A and the bottom coil element 101B have the same magnetic polarity (either north or south).

The top magnetic element 113 and the bottom magnetic element 115 each have a north pole ("N") and a south pole ("S"). In the example barrel lens assembly of FIG. 1C and FIGS. 4A-4C, the top magnetic element 113 is positioned with its north pole toward the front of the barrel lens assembly 111 and its south pole toward the rear of the barrel lens assembly 111, while the bottom magnetic element 115 is positioned with its south pole toward the front of the barrel lens assembly 111 and its north pole toward the rear of the barrel lens assembly 111.

In accordance with some embodiments of the present disclosure, the barrel lens assembly 111 is moveable to a plurality of barrel lens assembly positions. To move the example barrel lens assembly 111 towards a front of the example multi-focus-position lens apparatus 100, such as into the first or forward position shown in FIG. 4B, the polarities of the top coil current that powers the top coil element 101A and of the bottom coil current that powers the bottom coil element 101B are selected such that the magnetic field polarity on the bottom surface of the top coil element 101A is north and such that the magnetic field polarity on the top surface of the bottom coil element 101B is south. The north magnetic field on the bottom surface of the top coil element 101A will repel the north pole and attract the south pole of the top magnetic element 113, thereby applying a forward magnetic force (i.e., toward the left in FIGS. 4A-4C) to the top magnetic element 113. Similarly, the south magnetic field on the top surface of the bottom coil element 101B will repel the south pole and attract the north pole of the bottom magnetic element 115, thereby also applying a forward magnetic force (i.e., toward the left in FIGS. 4A-4C) to the bottom magnetic element 115.

Because the top magnetic element 113 and the bottom magnetic element 115 are secured to the barrel lens assembly 111, the forward magnetic force on the top magnetic element 113 and the bottom magnetic element 115 causes the barrel lens assembly 111 to move towards the front end of the example multi-focus-position lens apparatus 100 (for example, towards a front end of the module holder 135) as well. As described above, the bearing balls between the barrel lens assembly and the module holder may facilitate the movement of the barrel lens assembly relative to the module holder.

To move the example barrel lens assembly 111 towards a rear of the example multi-focus-position lens apparatus 100, such as into the second or rearward position shown in FIG. 4C, the polarities of the top coil current that powers the top coil element 101A and of the bottom coil current that powers the bottom coil element 101B are selected such that the magnetic field polarity on the bottom surface of the top coil element 101A is south and such that the magnetic field polarity on the top surface of the bottom coil element 101B is north. The south magnetic field on the bottom surface of the top coil element 101A will repel the south pole and attract the north pole of the top magnetic element 113, thereby applying a rearward magnetic force (i.e., toward the right in FIGS. 4A-4C) to the top magnetic element 113. Similarly, the north magnetic field on the top surface of the bottom coil element 101B will repel the north pole and attract the south pole of the bottom magnetic element 115, thereby also applying a rearward magnetic force (i.e., toward the right in FIGS. 4A-4C) to the bottom magnetic element 115.

Because the top magnetic element 113 and the bottom magnetic element 115 are secured to the barrel lens assembly 111, the rearward magnetic force on the top magnetic element 113 and the bottom magnetic element 115 causes the barrel lens assembly 111 to move towards the rear end of the example multi-focus-position lens apparatus 100 (for example, towards a rear end of the module holder 135) as well.

The polarities of the top coil current and the bottom coil current are opposite for moving the example barrel lens assembly forward or rearward. Controlling the current and therefore the movement of the example barrel lens assembly 111 to the desired focus position is discussed further below.

As the barrel lens assembly 111 is moveable to a plurality of barrel lens assembly positions along the optical axis 119, different barrel lens assembly positions can provide different distances between the at least one lens element of the barrel lens assembly 111 and the object of which the example multi-focus-position lens apparatus 100 captures an image. Further, a change of the barrel lens assembly position along the optical axis 119 also causes a change of a focal point location on the optical axis 119 (e.g. the focal point of the barrel lens assembly 111). As such, various embodiments of the present disclosure provide a multi-focus-position lens apparatus that overcomes various technical challenges and difficulties described above.

When the example barrel lens assembly is in a non-neutral position, such as the first position in FIG. 4B or the second position in FIG. 4C, in some embodiments the example barrel lens assembly is moved back to the neutral position by removing the top coil current and the bottom coil current which will eliminate the magnetic field produced by the top coil element 101A and the bottom coil element 101B.

Figure 6:
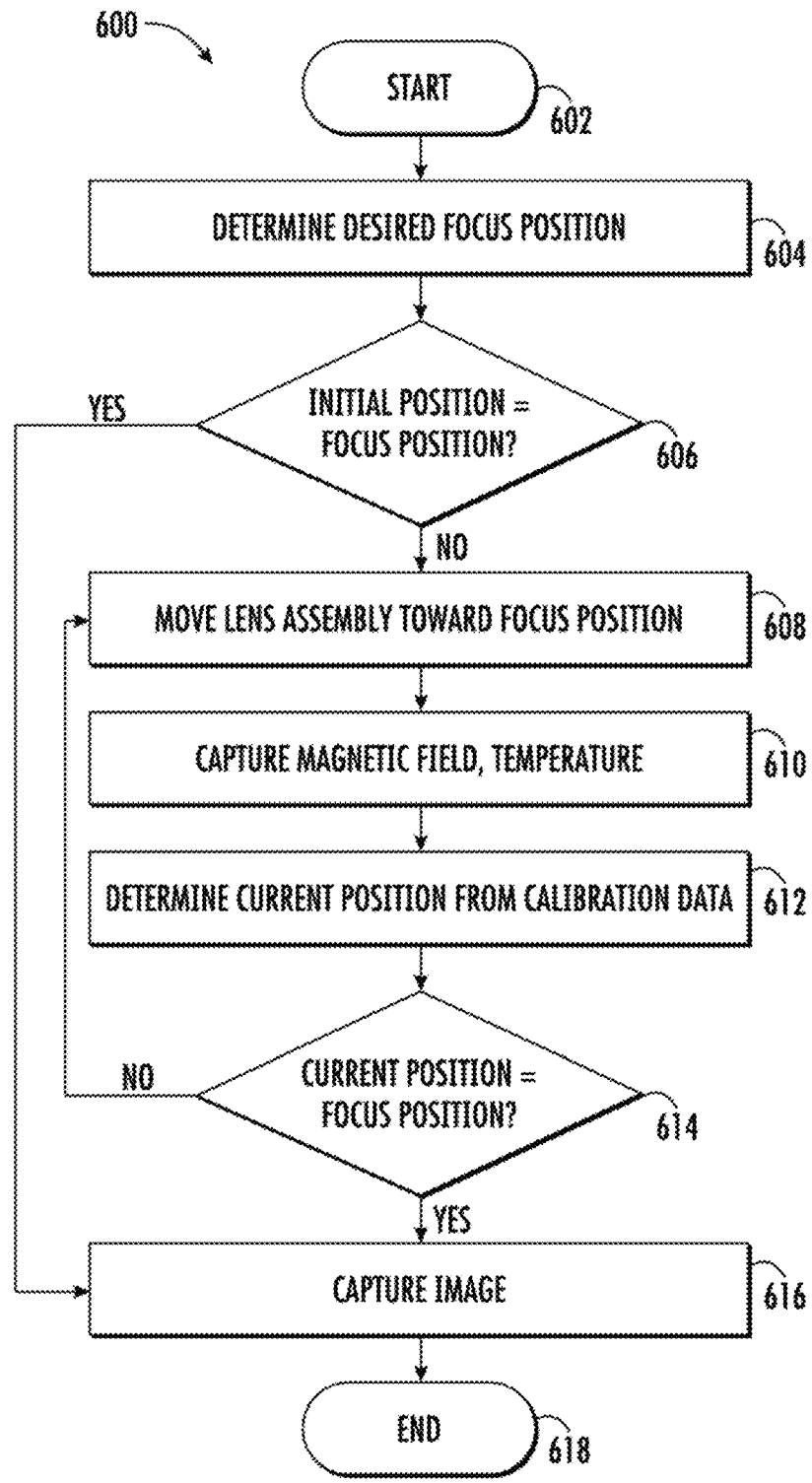
FIG. 6 illustrates an example method of setting an example barrel lens assembly position of an example barrel lens assembly within an example multi-focus-position lens apparatus, in accordance with some embodiments of the present disclosure.

Referring now to FIG. 6, an example method for operating an example multi-focus-position lens apparatus is provided. It is noted that each block of the flowchart, and combinations of blocks in the flowchart, may be implemented by various means such as hardware, firmware, circuitry and/or other devices associated with execution of software including one or more computer program instructions. For example, one or more of the procedures described in FIG. 6 may be embodied by computer program instructions, which may be stored by a non-transitory memory of an apparatus employing an embodiment of the present disclosure and executed by a processor in the apparatus. These computer program instructions may direct a computer or other programmable apparatus to function in a particular manner, such that the instructions stored in the computer-readable storage memory produce an article of manufacture, the execution of which implements the function specified in the flowchart block(s).

As described above and as will be appreciated based on this disclosure, embodiments of the present disclosure may be configured as methods, mobile devices, backend network devices, and the like. Accordingly, embodiments may comprise various means including entirely of hardware or any combination of software and hardware. Furthermore, embodiments may take the form of a computer program product on at least one non-transitory computer-readable storage medium having computer-readable program instructions (e.g., computer software) embodied in the storage medium. Similarly, embodiments may take the form of a computer program code stored on at least one non-transitory computer-readable storage medium. Any suitable computer-readable storage medium may be utilized including non-transitory hard disks, CD-ROMs, flash memory, optical storage devices, or magnetic storage devices.

There are different types of multi-focus-position lens apparatuses. For example, some multi-focus-position lens apparatuses automatically scan an object placed in the field of view and operate in what may be termed "trigger-free mode," "hands-free mode," "presentation scanning mode," or the like. Other multi-focus-position lens apparatuses use triggers or other similar user-interface components to cause the device to scan an object. Different types of multi-focus-position lens apparatuses may use somewhat different focusing strategies.

In some embodiments, a multi-focus-position lens apparatus will try to capture an image using a focus position that has been determined to be most likely to allow the device to successfully capture an image. In some embodiments, this determination is based on which focus position has previously been successful, and often on which focus position was most recently successful. In some embodiments, if that first-tried focus position is unsuccessful (e.g., the bar code could not be read), the multi-focus-position lens apparatus will try to capture the image using a focus position that has been determined to be second most likely to allow the device to successfully capture an image. In some embodiments, if that second-tried focus position is unsuccessful, the multifocus-position lens apparatus will try to capture the image using a focus position that has been determined to be third most likely to allow the device to successfully capture an image. In some embodiments, this process may continue until all possible focus positions are tried (if there are more than three focus positions).

In some embodiments, a trigger-free multi-focus-position lens apparatus mode will keep the lens in the successful focus position for the next scan to maximize the continuous scan throughput until image capture failure has occurred and a different focus position must be used. In some embodiments, in trigger mode (which may also be termed handheld mode), lens position will not be maintained such that power consumption may be reduced/minimized as many handheld scanners are battery powered. In some embodiments, in such a trigger mode the lens will return to the previous successful focus position when the trigger is pulled. In general, both types of scanners will typically turn to a power saving mode after no activity for a predetermined period of time and return to a neutral, non-powered position. In some embodiments, the return to a neutral position is achieved by removing power from the coil elements such that the magnetic attraction between the between the top positioning pad and the top magnetic element and between the bottom positioning pad and the bottom magnetic element 115 cause the barrel lens assembly to move to and be retained in the neutral position.

Referring now to FIG. 6, an example method 600 of providing closed-loop focus position control of an example barrel lens assembly within an example multi-focus-position lens apparatus is illustrated, in accordance with some embodiments of the present disclosure.

The example method 600 starts at step/operation 602. At step/operation 604, a processing circuitry (for example but not limited to, the processing circuitry 501 of the example multi-focus-position lens apparatus 500 described above in connection with FIG. 5) determines a desired focus position. The desired focus position is the position of the barrel lens assembly that is expected to allow the example multi-focus-position lens apparatus to successfully capture an image of an object in the field of view of the example multi-focus-position lens apparatus. As described above, the desired focus position may be the immediately preceding successful focus position or a focus position that has historically been successful.

At step/operation 606, a processing circuitry (for example but not limited to, the processing circuitry 501 of the example multi-focus-position lens apparatus 500 described above in connection with FIG. 5) determines if the initial position is the desired focus position. The initial position is the position of the barrel lens assembly at the start of a new scanning operation. In some embodiments, the processing circuitry may use as the initial position the most recent position used.

In some embodiments, determining if the initial position is the desired focus position comprises determining if the initial position is within a predetermined distance of the desired focus position. For example, in some embodiments determining if the initial position is the desired focus position comprises determining if the initial position is within five microns of the desired focus position.

If it is determined at step/operation 606 that the initial position is the desired focus position, the method will proceed to step/operation 616 in which a processing circuitry (for example but not limited to, the processing circuitry 501 of the example multi-focus-position lens apparatus 500 described above in connection with FIG. 5) will cause an image to be captured (by, for example but not limited to, the imaging circuitry 521 of the example multi-focus-position lens apparatus 500 described above in connection with FIG. 5) of whatever is in the field of view of the example multi-focus-position lens apparatus.

If it is determined at step/operation 606 that the initial position is not the desired focus position, the method will proceed to step/operation 608 in which a processing circuitry (for example but not limited to, the processing circuitry 501 of the example multi-focus-position lens apparatus 500 described above in connection with FIG. 5) will move the barrel lens assembly toward the desired focus position by causing a current to be provided to the top and bottom positioning coils (via, for example but not limited to, the top coil variable power circuitry 509 and the bottom coil variable power circuitry 511 of the example multi-focus-position lens apparatus 500 described above in connection with FIG. 5). The polarity of the current provided to the top and bottom positioning coils will depend on whether the desired focus position is forward or rearward of the initial position. The magnitude of the current provided to the top and bottom positioning coils may be a current that has been predetermined to have historically been appropriate to move the barrel lens assembly from the specific initial position to the specific desired focus position.

As a current is being provided to the top coil and the bottom coil and the lens barrel assembly is moving from the initial position toward the desired focus position, at step/operation 610 a processing circuitry (for example but not limited to, the processing circuitry 501 of the example multi-focus-position lens apparatus 500 described above in connection with FIG. 5) will determine and capture the magnetic field and the temperature within the example multi-focus-position lens apparatus 500 (via, for example but not limited to, the magnetic field sensor 517 and the temperature sensor 519 of the example multi-focus-position lens apparatus 500 described above in connection with FIG. 5).

At step/operation 612 a processing circuitry (for example but not limited to, the processing circuitry 501 of the example multi-focus-position lens apparatus 500 described above in connection with FIG. 5) will use the magnetic field and temperature captured at step/operation 610 look those values up in the calibration data (which may be stored in, for example but not limited to, the data storage media 505 of the example multi-focus-position lens apparatus 500 described above in connection with FIG. 5), and find the barrel lens assembly position in the calibration data that corresponds to the magnetic field and temperature captured at step/operation 610. The barrel lens assembly position in the calibration data that corresponds to the magnetic field and temperature captured at step/operation 610 is the current position of the barrel lens assembly.

At step/operation 614, a processing circuitry (for example but not limited to, the processing circuitry 501 of the example multi-focus-position lens apparatus 500 described above in connection with FIG. 5) determines if the current position (determined at step/operation 612) is the desired focus position.

In some embodiments, determining if the current position is the desired focus position comprises determining if the current position is within a predetermined distance of the desired focus position. For example, in some embodiments determining if the current position is the desired focus position comprises determining if the current position is within five microns of the desired focus position.

If it is determined at step/operation 614 that the current position is the desired focus position, the method will proceed to step/operation 616 in which a processing circuitry (for example but not limited to, the processing circuitry 501 of the example multi-focus-position lens apparatus 500 described above in connection with FIG. 5) will cause an image to be captured (by, for example but not limited to, the imaging circuitry 521 of the example multi-focus-position lens apparatus 500 described above in connection with FIG. 5) of whatever is in the field of view of the example multi-focus-position lens apparatus.

If it is determined at step/operation 614 that the initial position is not the desired focus position, the method will return to step/operation 608 in which a processing circuitry (for example but not limited to, the processing circuitry 501 of the example multi-focus-position lens apparatus 500 described above in connection with FIG. 5) will move the barrel lens assembly toward the desired focus position by adjusting the current provided to the top and bottom positioning coils. The adjustment to the current provided to the top and bottom positioning coils may depend, for example, on the current position of the barrel lens assembly, the distance between the current position and the desired focus position, the magnetic field determined at step/operation 610, and/or the temperature determined at step/operation 610. In some embodiments, the processing circuitry uses a proportional-integral-derivative (PID) feedback loop to determine an appropriate adjustment to the current provided to the top and bottom positioning coils with a goal of achieving the desired focus position quickly with minimal overshoot.

After adjusting the current at step/operation 608, at step/operation 610 a processing circuitry (for example but not limited to, the processing circuitry 501 of the example multi-focus-position lens apparatus 500 described above in connection with FIG. 5) will determine and capture the magnetic field and the temperature within the example multi-focus-position lens apparatus 500 (via, for example but not limited to, the magnetic field sensor 517 and the temperature sensor 519 of the example multi-focus-position lens apparatus 500 described above in connection with FIG. 5).

At step/operation 612 a processing circuitry (for example but not limited to, the processing circuitry 501 of the example multi-focus-position lens apparatus 500 described above in connection with FIG. 5) will use the magnetic field and temperature captured at step/operation 610, look those values up in the calibration data, and determine the current position of the barrel lens assembly from the calibration data.

At step/operation 614, a processing circuitry (for example but not limited to, the processing circuitry 501 of the example multi-focus-position lens apparatus 500 described above in connection with FIG. 5) determines if the current position (determined at step/operation 612) is the desired focus position.

If it is determined at step/operation 614 that the current position is the desired focus position, the method will proceed to step/operation 616 in which a processing circuitry (for example but not limited to, the processing circuitry 501 of the example multi-focus-position lens apparatus 500 described above in connection with FIG. 5) will cause an image to be captured (by, for example but not limited to, the imaging circuitry 521 of the example multi-focus-position lens apparatus 500 described above in connection with FIG. 5) of whatever is in the field of view of the example multi-focus-position lens apparatus.

If it is determined at step/operation 614 that the initial position is not the desired focus position, the method will continue to repeat steps/operations 608, 610, 612, and 614 until the current position is the desired focus position and then proceed to step/operation 616 to capture an image. The use of a PID feedback loop, as described above, should reduce/minimize the number of times steps/operations 608, 610, 612, and 614 need be repeated.

The example method 600 ends at step/operation 618.

After an image is successfully captured at step/operation 616, in some embodiments the current position of the barrel lens assembly will be maintained until the next time an image needs to be captured (or possibly until there has been no activity for a predetermined period of time and the device enters a power saving mode). If the position to be maintained is a non-neutral position, the magnetic field strength and temperature will be repeatedly monitored (for example, every few seconds) and compared to the calibration data to ensure the current position is being maintained. If the barrel lens assembly moves unexpectedly, the barrel lens assembly position will be adjusted as described above.

Although not illustrated in FIG. 6, if image capture is unsuccessful at step/operation 616, in some embodiments the method will return to step/operation 604 to determine the next desired focus position to use (which may be, for example, a focus position that has been determined to be second most likely to allow the device to successfully capture an image).

The examples above illustrate various technical improvements and benefits provided by some embodiments of the present disclosure. Conventional multi-focus-position lens apparatuses are difficult to manufacture because of the difficulty of accurately positioning mechanical position stops, and the mechanical stops may shift position due to mechanical impacts to the multi-focus-position lens apparatus. Various embodiments of the present disclosure provide a multi-focus-position lens apparatus with closed loop focus positioning that does not rely on mechanical stops.

It is to be understood that the disclosure is not to be limited to the specific embodiments disclosed, and that modifications and other embodiments are intended to be included within the scope of the appended claims. Although specific terms are employed herein, they are used in a generic and descriptive sense only and not for purposes of limitation, unless described otherwise.

The invention claimed is:

1. A multi-focus-position lens apparatus comprising:
a barrel lens assembly comprising a top magnetic element secured on a top portion of the barrel lens assembly and a bottom magnetic element secured on a bottom portion of the barrel lens assembly, wherein the barrel lens assembly is moveable along a longitudinal axis of the barrel lens assembly;
a top coil element positioned at least partly above the barrel lens assembly;
a bottom coil element positioned at least partly below the barrel lens assembly;
a top ferrous core positioned in a center of the top coil element;
a bottom ferrous core positioned in a center of the bottom coil element;
at least one processor; and
at least one non-transitory memory comprising program code;
wherein the at least one non-transitory memory and the program code are configured to, with the at least one processor, cause the lens apparatus to at least apply a top coil current to the top coil element and a bottom coil current to the bottom coil element to cause movement of the barrel lens assembly toward a predetermined desired focus position;
wherein the predetermined desired focus position is between a neutral position and a mechanically-defined overtravel position; and
wherein the neutral position is a position the barrel lens assembly will attain when no top coil current is applied to the top coil element and no bottom coil current is applied to the bottom coil element such that a magnetic attraction between the top magnetic element and the top ferrous core and between the bottom magnetic element and the bottom ferrous core causes the barrel lens assembly to move to and/or remain at the neutral position.

2. The multi-focus-position lens apparatus of claim 1, further comprising:
a magnetic field sensor for detecting a magnetic field within the lens apparatus; and
a temperature sensor for detecting a temperature within the lens apparatus;
wherein the at least one non-transitory memory stores predetermined calibration data comprising a plurality of corresponding magnetic field values, temperatures, and positions; and
wherein the at least one non-transitory memory and the program code are further configured to, with the at least one processor, cause the lens apparatus to at least:
capture, from the magnetic field sensor, a magnetic field within the lens apparatus;
capture, from the temperature sensor, a temperature within the lens apparatus;
compare the captured magnetic field and the captured temperature to the predetermined calibration data to determine a current position of the barrel lens assembly;
determine if the current position is the predetermined desired focus position;
if the current position is not the predetermined desired focus position, adjust the top coil current and the bottom coil current to cause movement of the barrel lens assembly from the current position toward the predetermined desired focus position, and repeat the first capture step, the second capture step, the compare step, the determine step, and the adjust step until the current position is the predetermined desired focus position; and
if the current position is the predetermined desired focus position, capture an image of a target in a field of view of the barrel lens assembly.

3. The multi-focus-position lens apparatus of claim 2, wherein determining if the current position is the desired focus position comprises determining if the current position is within a predetermined distance of the desired focus position.

4. The multi-focus-position lens apparatus of claim 2, wherein the at least one non-transitory memory and the program code are configured to, with the at least one processor, further cause the lens apparatus to determine if an initial position of the barrel lens assembly is the desired focus position.

5. The multi-focus-position lens apparatus of claim 2, wherein the at least one non-transitory memory and the program code are configured to, with the at least one processor, further cause the lens apparatus to use a proportional-integral-derivative feedback loop to adjust the top coil current and the bottom coil current to cause movement of the barrel lens assembly from the current position toward the desired focus position.

6. The multi-focus-position lens apparatus of claim 2, further comprising:
a top ferrous core positioned in a center of the top coil element; and
a bottom ferrous core positioned in a center of the bottom coil element;
wherein a hole is defined in either the top ferrous core or the bottom ferrous core; and
wherein the magnetic field sensor and the temperature sensor are positioned within the hole defined in either the top ferrous core or the bottom ferrous core.

7. The multi-focus-position lens apparatus of claim 6, wherein the barrel lens assembly has at least three possible desired focus positions;
wherein a first one of the at least three possible desired focus positions is a neutral position which the barrel lens assembly will attain when no top coil current is applied to the top coil element and no bottom coil current is applied to the bottom coil element such that a magnetic attraction between the top magnetic element and the top ferrous core and between the bottom magnetic element and the bottom ferrous core causes the barrel lens assembly to move to and/or remain at the neutral position;
wherein a second one of the at least three possible desired focus positions is a forward position in a first direction along the longitudinal axis of the barrel lens assembly away from the neutral position; and
wherein a third one of the at least three possible desired focus positions is a rearward position in a second direction along the longitudinal axis of the barrel lens assembly away from the neutral position, the second direction being opposite the first direction.

8. The multi-focus-position lens apparatus of claim 7, further comprising:
a front mechanical stop positioned to prevent overtravel in the first direction; and
a rear mechanical stop positioned to prevent overtravel in the second direction;
wherein the second one of the at least three possible desired focus positions is rearward of the front mechanical stop such that the barrel lens assembly does not contact the front mechanical stop in the second one of the at least three possible desired focus positions; and
wherein the third one of the at least three possible desired focus positions is forward of the rear mechanical stop such that the barrel lens assembly does not contact the rear mechanical stop in the third one of the at least three possible desired focus positions.

9. The multi-focus-position lens apparatus of claim 7, wherein a fourth one of the at least three possible desired focus positions is located between the forward position and the neutral position; and
wherein a fifth one of the at least three possible desired focus positions is located between the rearward position and the neutral position.

10. The multi-focus-position lens apparatus of claim 2, further comprising:
a top coil variable power circuitry electronically coupled to the top coil element to provide the top coil current to the top coil element; and a bottom coil variable power circuitry electronically coupled to the bottom coil element to provide the bottom coil current to the bottom coil element.

11. A method for focusing a multi-focus-position lens apparatus, the method comprising:
applying a top coil current to a top coil element of the lens apparatus and a bottom coil current to a bottom coil element of the lens apparatus to cause movement of a barrel lens assembly of the lens apparatus toward a desired focus position;
wherein the barrel lens assembly comprises a top magnetic element secured on a top portion of the barrel lens assembly and a bottom magnetic element secured on a bottom portion of the barrel lens assembly;
wherein the barrel lens assembly is moveable along a longitudinal axis of the barrel lens assembly;
wherein the top coil element is positioned at least partly above the barrel lens assembly;
wherein the bottom coil element is positioned at least partly below the barrel lens assembly;
wherein a top ferrous core is positioned in a center of the top coil element;
wherein a bottom ferrous core is positioned in a center of the bottom coil element;
wherein the predetermined desired focus position is between a neutral position and a mechanically-defined overtravel position; and
wherein the neutral position is a position the barrel lens assembly will attain when no top coil current is applied to the top coil element and no bottom coil current is applied to the bottom coil element such that a magnetic attraction between the top magnetic element and the top ferrous core and between the bottom magnetic element and the bottom ferrous core causes the barrel lens assembly to move to and/or remain at the neutral position.

12. The method of claim 11, further comprising:
capturing, from a magnetic field sensor of the lens apparatus, a magnetic field within the lens apparatus;
capturing, from a temperature sensor of the lens apparatus, a temperature within the lens apparatus;
comparing the captured magnetic field and the captured temperature to predetermined calibration data to determine a current position of the barrel lens assembly;
determining if the current position is the desired focus position;
if the current position is not the desired focus position, adjusting the top coil current and the bottom coil current to cause movement of the barrel lens assembly from the current position toward the desired focus position, and repeating the first capturing step, the second capturing step, the comparing step, the determining step, and the adjusting step until the current position is the desired focus position; and
if the current position is the desired focus position, capturing an image of a target in a field of view of the barrel lens assembly;
wherein the predetermined calibration data comprises a plurality of corresponding magnetic field values, temperatures, and positions.

13. The method of claim 12, wherein determining if the current position is the desired focus position comprises determining if the current position is within a predetermined distance of the desired focus position.

14. The method of claim 12, further comprising determining if an initial position of the barrel lens assembly is the desired focus position.

15. The method of claim 12, wherein adjusting the top coil current and the bottom coil current to cause movement of the barrel lens assembly from the current position toward the desired focus position comprises using a proportional-integral-derivative feedback loop to adjust the top coil current and the bottom coil current to cause movement of the barrel lens assembly from the current position toward the desired focus position.

16. The method of claim 12, wherein the lens apparatus further comprises:
a top ferrous core positioned in a center of the top coil element;
a bottom ferrous core positioned in a center of the bottom coil element;
wherein a hole is defined in either the top ferrous core or the bottom ferrous core; and
wherein the magnetic field sensor and the temperature sensor are positioned within the hole defined in either the top ferrous core or the bottom ferrous core.

17. The method of claim 16, wherein the barrel lens assembly has at least three possible desired focus positions;
wherein a first one of the at least three possible desired focus positions is a neutral position which the barrel lens assembly will attain when no top coil current is applied to the top coil element and no bottom coil current is applied to the bottom coil element such that a magnetic attraction between the top magnetic element and the top ferrous core and between the bottom magnetic element and the bottom ferrous core causes the barrel lens assembly to move to and/or remain at the neutral position;
wherein a second one of the at least three possible desired focus positions is a forward position in a first direction along the longitudinal axis of the barrel lens assembly away from the neutral position; and
wherein a third one of the at least three possible desired focus positions is a rearward position in a second direction along the longitudinal axis of the barrel lens assembly away from the neutral position, the second direction being opposite the first direction.

18. The method of claim 17, wherein the lens apparatus further comprises:
a front mechanical stop positioned to prevent overtravel in the first direction; and
a rear mechanical stop positioned to prevent overtravel in the second direction;
wherein the second one of the at least three possible desired focus positions is rearward of the front mechanical stop such that the barrel lens assembly does not contact the front mechanical stop in the second one of the at least three possible desired focus positions; and
wherein the third one of the at least three possible desired focus positions is forward of the rear mechanical stop such that the barrel lens assembly does not contact the rear mechanical stop in the third one of the at least three possible desired focus positions.

19. The method of claim 17, wherein a fourth one of the at least three possible desired focus positions is located between the forward position and the neutral position; and
wherein a fifth one of the at least three possible desired focus positions is located between the rearward position and the neutral position.

20. The method of claim 12, wherein the lens apparatus further comprises:

a top coil variable power circuitry electronically coupled to the top coil element to provide the top coil current to the top coil element; and a bottom coil variable power circuitry electronically coupled to the bottom coil element to provide the bottom coil current to the bottom coil element.

* * * * *